(12) United States Patent
Chinone et al.

(10) Patent No.: US 12,222,387 B2
(45) Date of Patent: Feb. 11, 2025

(54) SEMICONDUCTOR DEVICE INSPECTION METHOD AND SEMICONDUCTOR DEVICE INSPECTION APPARATUS

(71) Applicant: HAMAMATSU PHOTONICS K.K., Hamamatsu (JP)

(72) Inventors: Norimichi Chinone, Hamamatsu (JP); Tomonori Nakamura, Hamamatsu (JP); Akira Shimase, Hamamatsu (JP); Shigeru Eura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 244 days.

(21) Appl. No.: 17/926,376

(22) PCT Filed: Apr. 5, 2021

(86) PCT No.: PCT/JP2021/014481
§ 371 (c)(1),
(2) Date: Nov. 18, 2022

(87) PCT Pub. No.: WO2021/241007
PCT Pub. Date: Dec. 2, 2021

(65) Prior Publication Data
US 2023/0184827 A1    Jun. 15, 2023

(30) Foreign Application Priority Data

May 26, 2020   (JP) .................................. 2020-091377

(51) Int. Cl.
*G01R 31/311*    (2006.01)
*G01R 31/28*    (2006.01)

(52) U.S. Cl.
CPC ........ *G01R 31/311* (2013.01); *G01R 31/2837* (2013.01)

(58) Field of Classification Search
CPC .. G01R 31/28; G01R 31/311; G01R 31/2837; G01R 31/308; G01R 31/31715; G01R 31/319
(Continued)

(56) References Cited

U.S. PATENT DOCUMENTS

2009/0003685 A1    1/2009   Nikawa

FOREIGN PATENT DOCUMENTS

| CN | 101527273 A | * | 9/2009 | ............. H01L 21/66 |
| JP | H6-300824 A | | 10/1994 | |

(Continued)

OTHER PUBLICATIONS

English Translation of WO 2019159597 A1 (Year: 2019).*
(Continued)

*Primary Examiner* — Alesa Allgood
*Assistant Examiner* — Courtney G McDonnough
(74) *Attorney, Agent, or Firm* — Faegre Drinker Biddle & Reath LLP

(57) ABSTRACT

A semiconductor inspection device includes: a measuring device that supplies power to a semiconductor device and measures the electrical characteristics; an optical scanning device that scans the semiconductor device with light intensity-modulated with a plurality of frequencies; a lock-in amplifier that acquires a characteristic signal indicating the electrical characteristics of the plurality of frequency components; and an inspection device that calculates a frequency at which the characteristic signal reflecting the electrical characteristics of a first layer and the characteristic signal reflecting the electrical characteristics of a second layer have a predetermined phase difference, corrects a phase component of the characteristic signal at an arbitrary scanning position with a phase component at the scanning position reflecting the electrical characteristics of the first layer as a (Continued)

reference, and outputs an in-phase component and a quadrature component at the arbitrary scanning position at the calculated frequency.

14 Claims, 19 Drawing Sheets

(58) Field of Classification Search
USPC .................................................. 324/754.23
See application file for complete search history.

(56) References Cited

FOREIGN PATENT DOCUMENTS

| | | | | | |
|---|---|---|---|---|---|
| JP | 2007078379 | A | * | 3/2007 | ............. G01R 31/00 |
| JP | 2010-197051 | A | | 9/2010 | |
| JP | 2011-047825 | A | | 3/2011 | |
| JP | 2013-526723 | A | | 6/2013 | |
| JP | 2016-014553 | A | | 1/2016 | |
| JP | 2016-534344 | A | | 11/2016 | |
| TW | 201903394 | A | | 1/2019 | |
| TW | 202004206 | A | | 1/2020 | |
| WO | WO-2011/156527 | A1 | | 12/2011 | |
| WO | WO-2013/008850 | A1 | | 1/2013 | |
| WO | WO-2015/024679 | A1 | | 2/2015 | |
| WO | WO-2018/061378 | A1 | | 4/2018 | |
| WO | WO-2019159597 | A1 | * | 8/2019 | ......... G01N 21/1717 |
| WO | WO-2021/241008 | A1 | | 12/2021 | |

OTHER PUBLICATIONS

English Translation of CN 101527273 A (Year: 2009).*
English Translation of JP 2007078379 A (Year: 2007).*
International Preliminary Report on Patentability issued Dec. 8, 2022 in WO Patent Application No. PCT/JP2021/014481.
Bharath Viswanath Ravi et al., "Investigation of Multiple Heat Source Effects in Lock-In Thermography Applications in Semiconductor Packages", IEEE Transactions on Components, Packaging and Manufacturing Technology, IEEE, USA, May 2018, vol. 8, No. 5, May 1, 2018, p. 725-p. 734, XP011683156.
Jacobs, K.J.P. et al., "Lock-in thermal laser stimulation for non-destructive failure localization in 3-D devices," Microelectronics Reliability, vol. 76-77, 2017, pp. 188-193.
Schmidt, Christian et al., "Non-destructive defect depth determination at fully packaged and stacked die devices using Lock-in Thermography," 2010 17th IEEE International Symposium on the Physical and Failure Analysis of Integrated Circuits, Jul. 5, 2010.

* cited by examiner

*Fig.7*
(a)
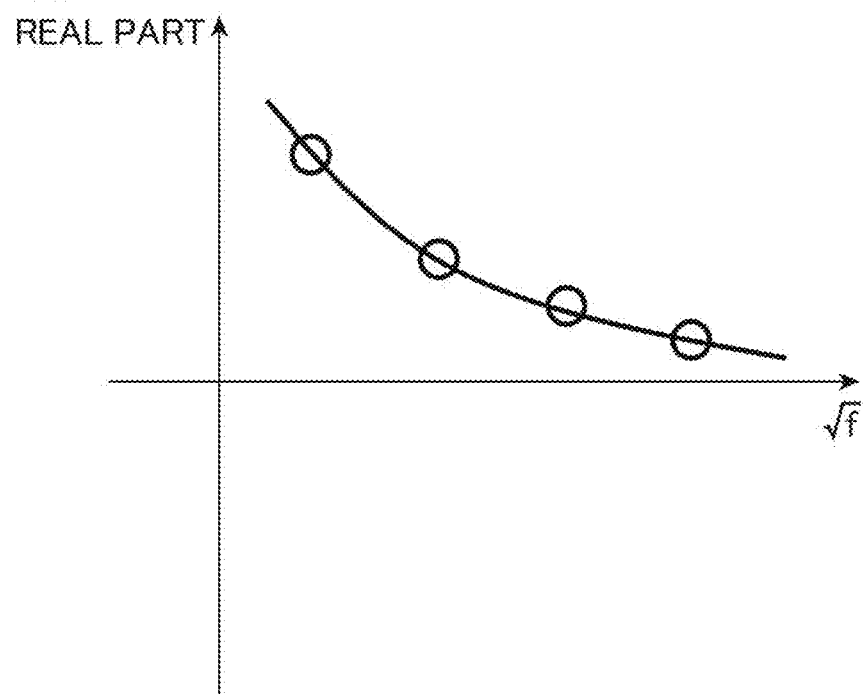
(b)
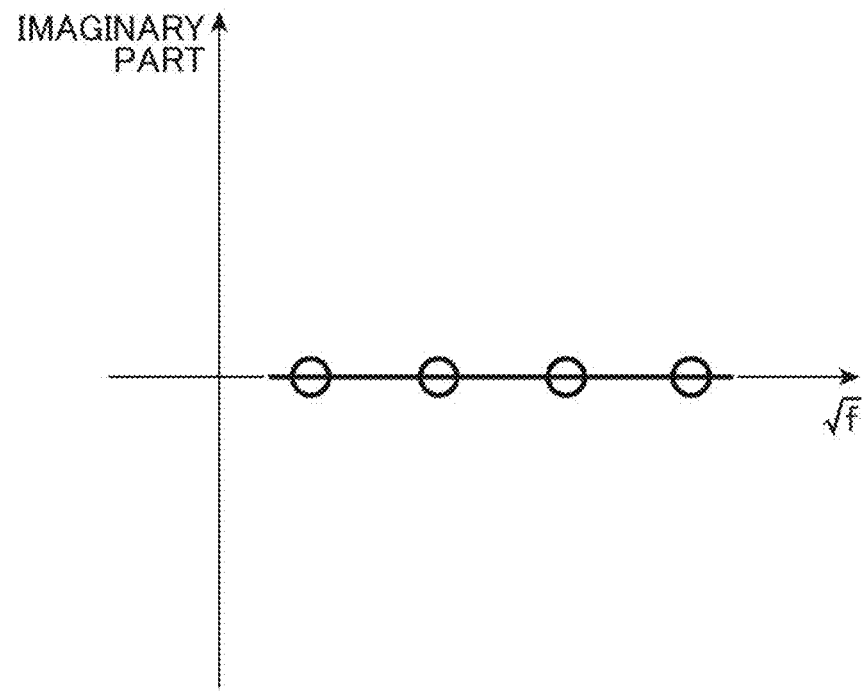

Fig.8
(a)
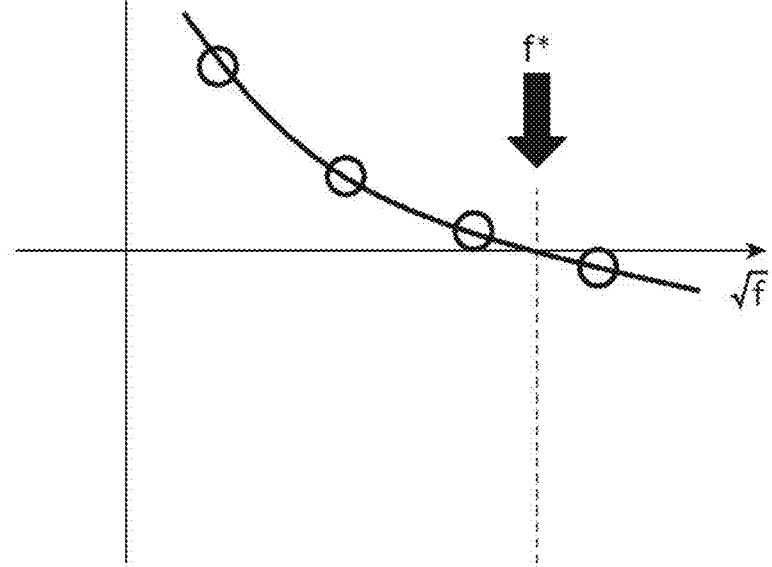
(b)
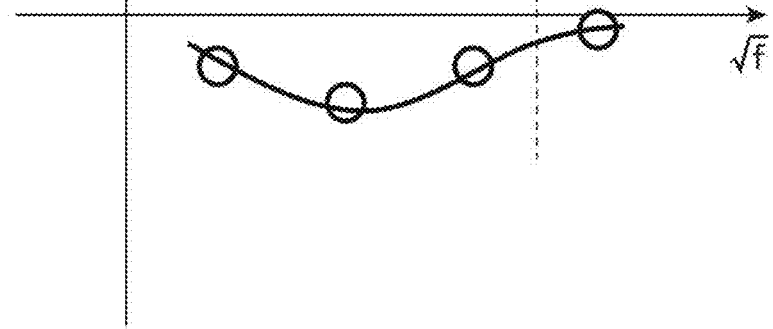

*Fig.9*
(a)
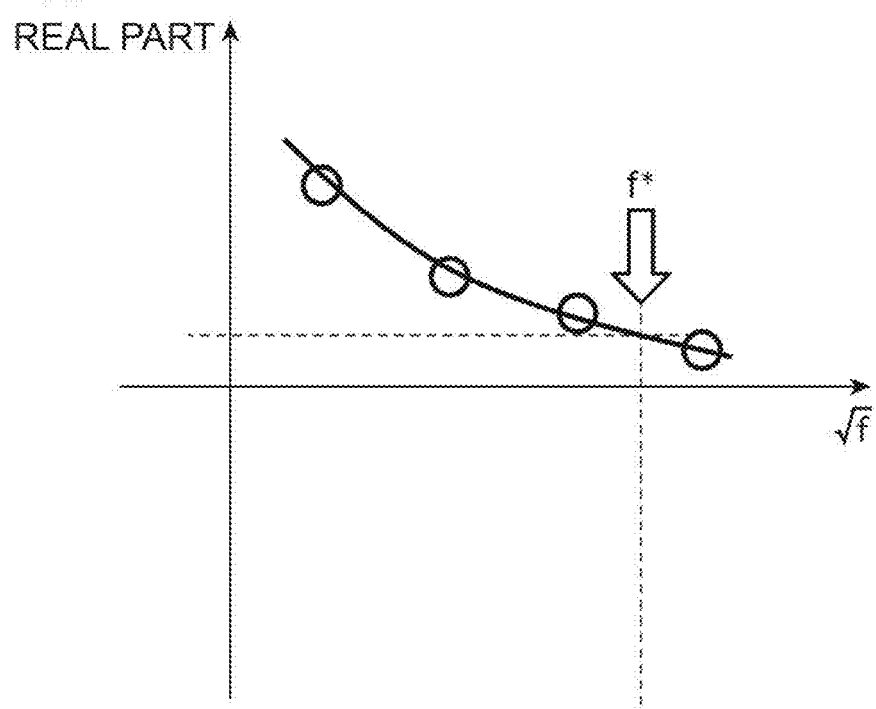
(b)
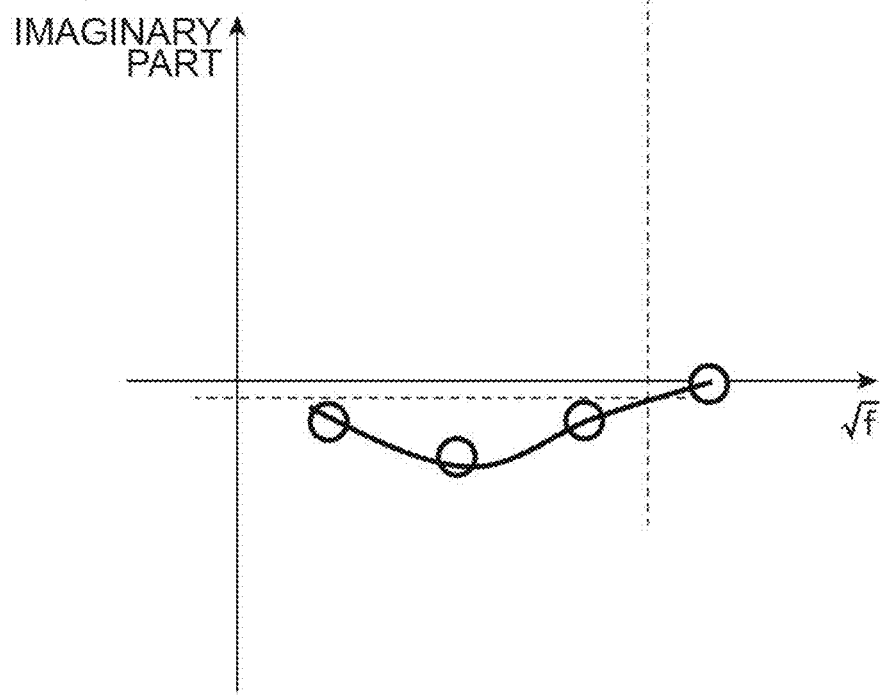

Fig.15
(a)
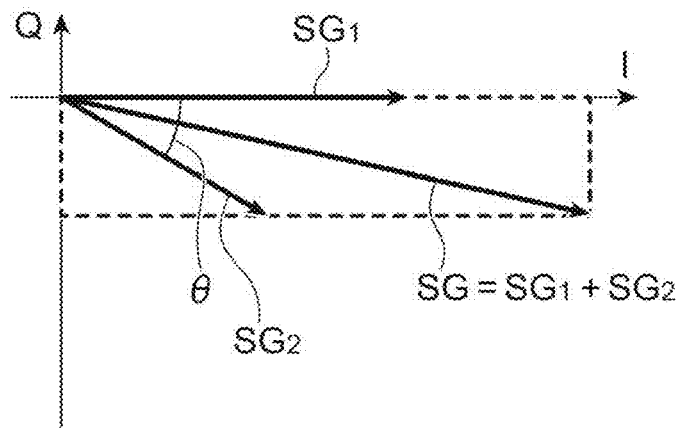
(b)
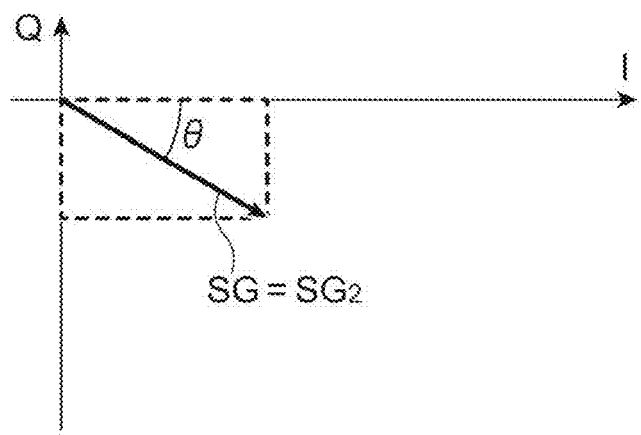
(c)
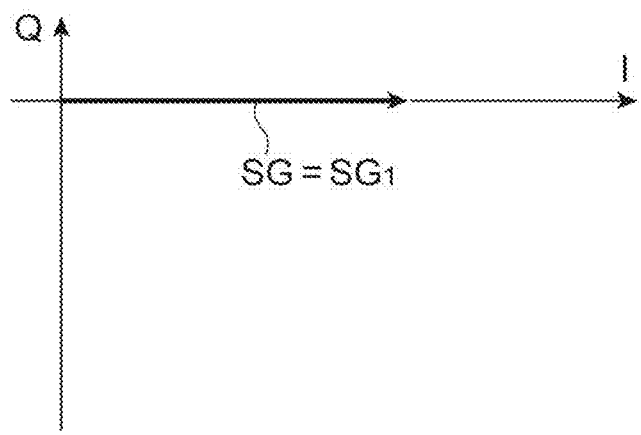

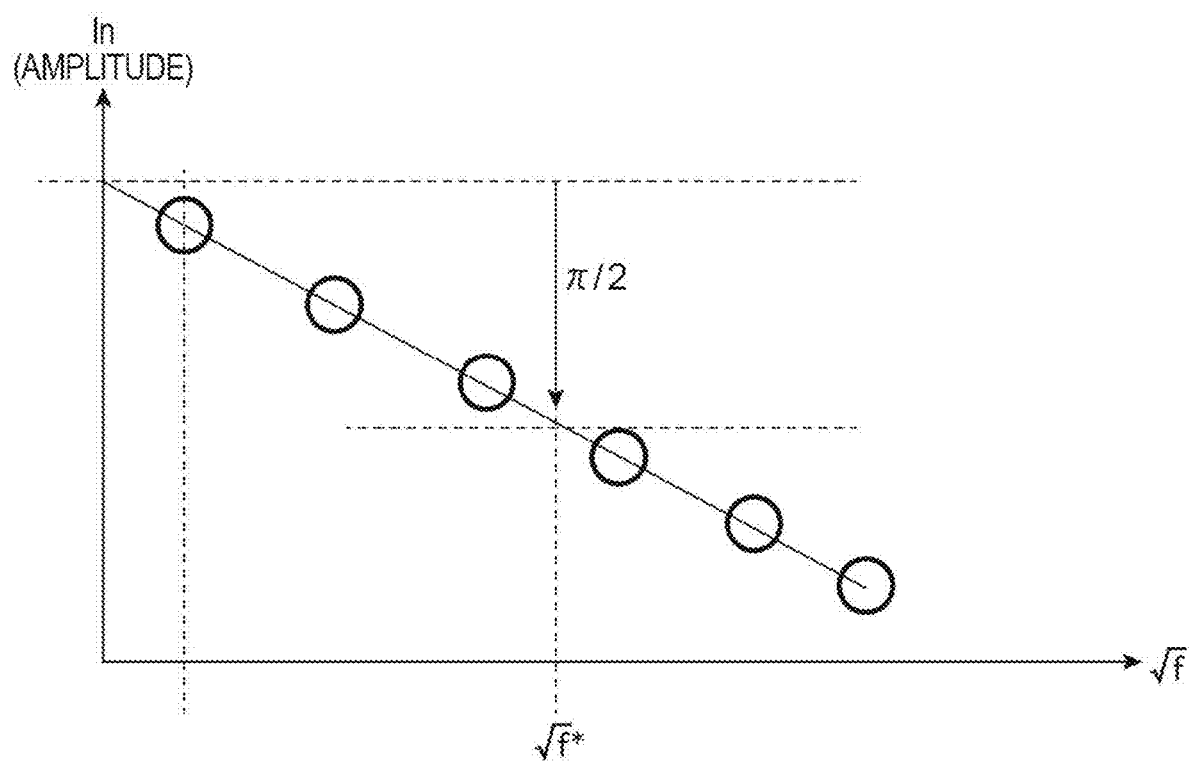

SEMICONDUCTOR DEVICE INSPECTION METHOD AND SEMICONDUCTOR DEVICE INSPECTION APPARATUS

TECHNICAL FIELD

One aspect of an embodiment relates to a semiconductor device inspection method and a semiconductor device inspection device.

BACKGROUND ART

Lock-in Optical Beam Induced Resistance Change (OBIRCH) has been known as a method for analyzing the electrical characteristics of a semiconductor device in which semiconductor chips are stacked in a three-dimensional manner (for example, see Non Patent Literature 1 below). According to this method, failure analysis of a semiconductor device is realized in a non-destructive manner by measuring changes in electrical characteristics, such as resistance, while scanning the semiconductor device with a laser.

CITATION LIST

Non Patent Literature

Non Patent Literature 1: K. J. P. Jacobs et al., "Lock-in thermal laser stimulation for non-destructive failure localization in 3-D devices", Microelectronics Reliability, Vol. 76-77 (2017), Pages 188-193.

SUMMARY OF INVENTION

Technical Problem

In the conventional method described above, when a semiconductor device in which semiconductor chips are stacked in a plurality of layers in the direction of laser emission is a target, it is desired to analyze the electrical characteristics corresponding to the stacked structure.

Therefore, one aspect of the embodiment has been made in view of such a problem, and it is an object thereof to provide a semiconductor device inspection method and a semiconductor device inspection device capable of analyzing electrical characteristics corresponding to the stacked structure of a semiconductor device.

Solution to Problem

A semiconductor device inspection method according to an aspect of an embodiment includes: a step of supplying power to a semiconductor device and measuring electrical characteristics of the semiconductor device according to the supply of the power; a step of scanning the semiconductor device with light intensity-modulated with a first frequency and light intensity-modulated with a second frequency higher than the first frequency and acquiring a characteristic signal indicating the electrical characteristics of the first frequency component and the second frequency component according to the scanning; a step of calculating a frequency of the characteristic signal at which the characteristic signal at a first scanning position reflecting the electrical characteristics of a first position in an optical axis direction of the light in the semiconductor device and the characteristic signal at a second scanning position reflecting the electrical characteristics of a second position in the optical axis direction of the light in the semiconductor device have a predetermined phase difference; a step of correcting a phase component of the characteristic signal at an arbitrary scanning position with a phase component of the characteristic signal at the first scanning position in the semiconductor device as a reference; and a step of acquiring the characteristic signal at the arbitrary scanning position at the calculated frequency and outputting an in-phase component and a quadrature component of the characteristic signal.

Alternatively, a semiconductor device inspection device according to another aspect of the embodiment includes: a measuring device configured to supply power to a semiconductor device and measure electrical characteristics of the semiconductor device according to the supply of the power; an optical scanning device configured to scan the semiconductor device with light intensity-modulated with a first frequency and light intensity-modulated with a second frequency higher than the first frequency; a signal acquisition device configured to acquire a characteristic signal indicating the electrical characteristics of the first frequency component and the second frequency component according to the scanning of the light; and a processor configured to process the characteristic signal. The processor calculates a frequency of the characteristic signal at which the characteristic signal at a first scanning position reflecting the electrical characteristics of a first position in an optical axis direction of the light in the semiconductor device and the characteristic signal at a second scanning position reflecting the electrical characteristics of a second position in the optical axis direction of the light in the semiconductor device have a predetermined phase difference, corrects a phase component of the characteristic signal at an arbitrary scanning position with a phase component of the characteristic signal at the first scanning position in the semiconductor device as a reference, acquires the characteristic signal at the arbitrary scanning position at the calculated frequency, and outputs an in-phase component and a quadrature component of the characteristic signal.

According to the one aspect or another aspect described above, a characteristic signal is acquired by measuring the electrical characteristics of the semiconductor device of the first frequency component and the second frequency component while scanning the semiconductor device with the light modulated with the first frequency and the light modulated with the second frequency. Then, based on the acquired characteristic signal, a frequency is calculated at which the characteristic signal at the first scanning position reflecting the electrical characteristics of the first position of the semiconductor device in the optical axis direction of the light and the characteristic signal at the second scanning position reflecting the electrical characteristics of the second position have a predetermined phase difference. In addition, the phase component of the characteristic signal at the arbitrary scanning position is corrected with the phase component of the characteristic signal at the first scanning position as a reference, a characteristic signal at the arbitrary scanning position at the calculated frequency is acquired, and the in-phase component and the quadrature component of the acquired characteristic signal are output. Therefore, it is possible to estimate the electrical characteristics of each layer at an arbitrary scanning position of the semiconductor device, and it is possible to analyze the electrical characteristics corresponding to the stacked structure of the semiconductor device.

Advantageous Effects of Invention

According to one aspect of the present invention, it is possible to analyze the electrical characteristics corresponding to the stacked structure of the semiconductor device.

BRIEF DESCRIPTION OF DRAWINGS

FIG. 7 is a graph showing an example of the relationship between the square root $f^{1/2}$ of a frequency and the real part and the imaginary part of a characteristic signal analyzed by the inspection device 19.

FIG. 8 is a graph showing an example of the relationship between the square root $f^{1/2}$ of a frequency and the real part and the imaginary part of a characteristic signal analyzed by the inspection device 19.

FIG. 9 is a graph showing an example of the relationship between the square root $f^{1/2}$ of a frequency and the real part and the imaginary part of a characteristic signal analyzed by the inspection device 19.

FIG. 15 is a diagram showing a corrected characteristic signal at each scanning position at a frequency, at which a predetermined phase difference is obtained, as a vector.

FIG. 19 is a graph plotting the relationship between the square root $f^{1/2}$ of a frequency and the natural logarithm of the characteristic signal analyzed by the inspection device 19 according to the modification example.

DESCRIPTION OF EMBODIMENTS

Figure 1:
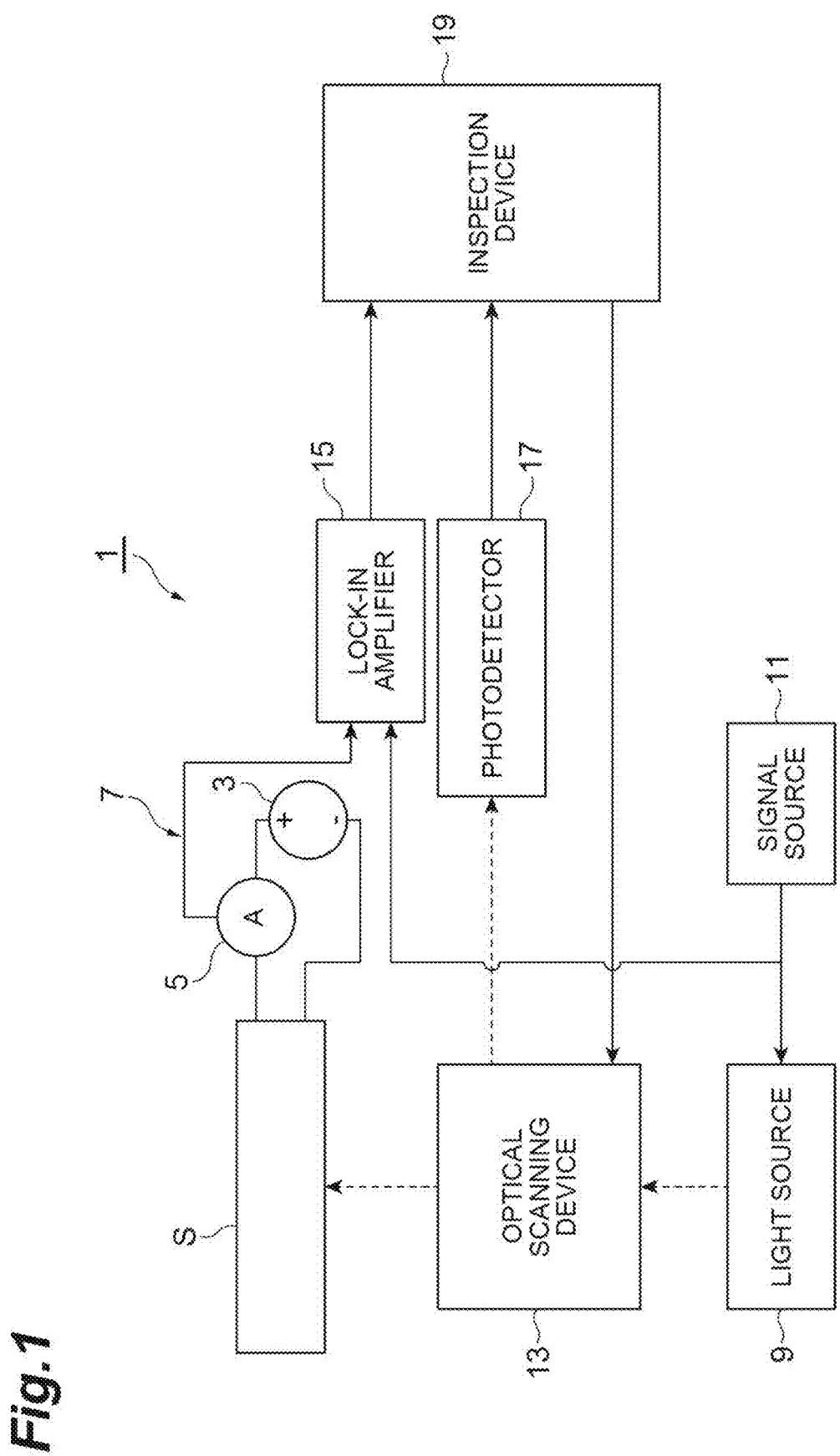
FIG. 1 is a schematic configuration diagram of a semiconductor inspection device 1 according to an embodiment.

Hereinafter, an embodiment of the present invention will be described in detail with reference to the accompanying diagrams. In addition, in the description, the same elements or elements having the same functions are denoted by the same reference numerals, and repeated description thereof will be omitted.

FIG. 1 is a schematic configuration diagram of a semiconductor inspection device 1, which is a semiconductor device inspection device according to an embodiment. The semiconductor inspection device 1 is a device for measuring the electrical characteristics at each point in order to analyze a failure portion of a semiconductor device, which is a device under test (DUT). As an object to be measured by the semiconductor inspection device 1, a semiconductor device in which a plurality of semiconductor chips are stacked in two or more layers is preferably used. In addition, in FIG. 1, the flow of electrical signals between devices is indicated by solid arrows, and the flow of optical signals between devices is indicated by dotted arrows.

That is, the semiconductor inspection device 1 is configured to include a measuring device 7 including a voltage application device 3 and a current measuring device 5, a light source 9, a signal source 11, an optical scanning device 13, a lock-in amplifier (signal acquisition device) 15, a photodetector 17, and an inspection device 19. Hereinafter, each component of the semiconductor inspection device 1 will be described in detail.

The measuring device 7 has two terminals. The two terminals are electrically connected to a semiconductor device S, so that a constant voltage is applied from the voltage application device 3 to the circuit formed in the semiconductor device S to supply the power. The current flowing through the semiconductor device S between the two terminals according to the supply is measured as an electrical characteristic by the current measuring device 5.

The light source 9 is, for example, a laser light source (emission source) that emits laser light. The light source 9 receives an AC signal generated at a variable frequency by the signal source 11 and generates laser light intensity-modulated by the frequency included in the AC signal. The AC signal may be a signal having a single frequency component, or may be a signal including a plurality of frequency components (for example, a rectangular wave signal). The optical scanning device 13 guides the laser light emitted from the light source 9 toward the semiconductor device S to irradiate the semiconductor device S, and scans the emission position of the laser light in the semiconductor device S in a two-dimensional manner along the surface of the semiconductor device S. Here, the two-dimensional scanning of the laser light in the optical scanning device 13 is controlled by the inspection device 19. In addition, the optical scanning device 13 guides reflected light, which is generated from the surface of the semiconductor device S according to the emission of the laser light, toward the photodetector 17. In addition, the light source 9 may be an SLD, an LED, a lamp light source, or the like that generates incoherent light.

The lock-in amplifier 15 monitors the AC signal output from the signal source 11 and receives a characteristic signal indicating the electrical characteristics measured by the measuring device 7, and extracts (lock-in detects) a frequency component having a modulation frequency of the laser light from the characteristic signal and outputs the frequency component to the inspection device 19. At this time, the lock-in amplifier 15 may extract a plurality of frequency components according to a plurality of frequency components included in the AC signal. The photodetector 17 receives reflected light generated by the semiconductor device S according to the laser light scanned by the optical scanning device 13, and outputs an intensity signal indicating the intensity of the reflected light to the inspection device 19.

The inspection device 19 is a data processor that is electrically connected to the lock-in amplifier 15, the photodetector 17, and the optical scanning device 13 and that controls two-dimensional scanning by the optical scanning device 13 and processes the characteristic signal from the lock-in amplifier 15 and the intensity signal from the photodetector 17.

Figure 2:
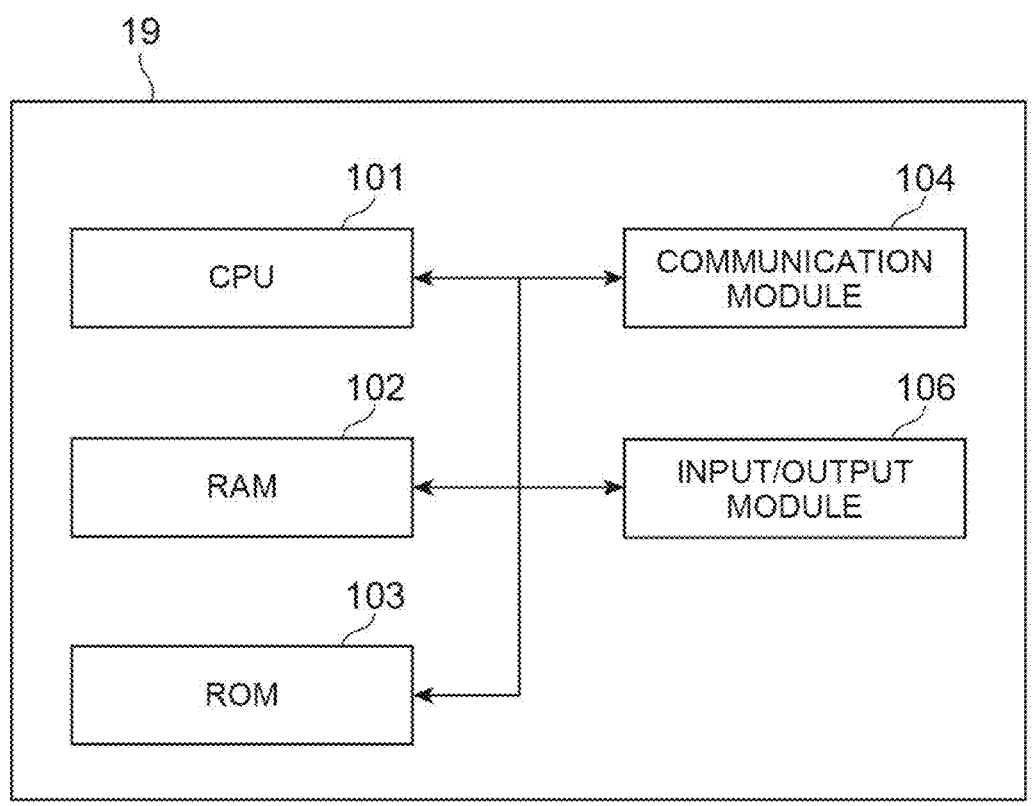
FIG. 2 is a block diagram showing an example of the hardware configuration of an inspection device 19 in FIG. 1.

FIG. 2 shows the hardware configuration of the inspection device 19. As shown in FIG. 2, the inspection device 19 is physically a computer including a CPU (Central Processing Unit) 101 as a processor, a RANI (Random Access Memory) 102 or a ROM (Read Only Memory) 103 as a recording medium, a communication module 104, an input/output module 106, and the like, which are electrically connected to each other. The function of the inspection device 19 is realized by reading a program or the like onto the hardware, such as the CPU 101 and the RAM 102, and by operating the communication module 104, the input/output module 106, and the like and performing data reading and writing in the RANI 102 under the control of the CPU 101. In addition, the inspection device 19 may include a display, a keyboard, a mouse, a touch panel display, and the like as input/output devices, and may include a data recording device, such as a hard disk drive and a semiconductor memory. In addition, the inspection device 19 may be configured by a plurality of computers.

Figure 3:
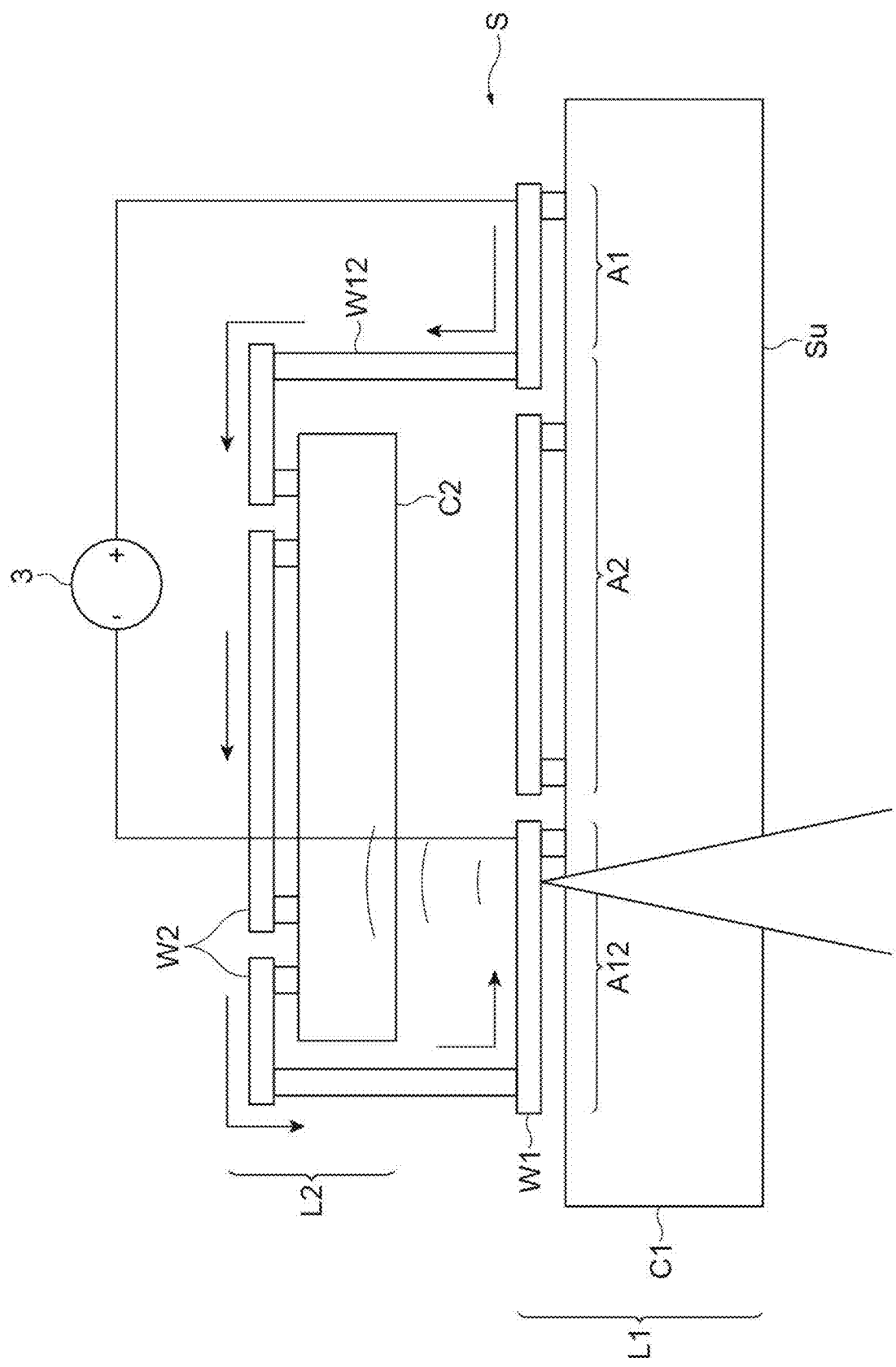
FIG. 3 is a diagram showing an example of a stacked structure of a semiconductor device S to be measured by the semiconductor inspection device 1.

FIG. 3 shows an example of the stacked structure of the semiconductor device S to be measured by the semiconductor inspection device 1. The semiconductor device S is a semiconductor device with a multilayer structure having at least a first layer L1 including a semiconductor circuit portion C1 and a wiring portion W1, a second layer L2 including a semiconductor circuit portion C2 and a wiring portion W2, and an interlayer wiring portion W12, for example. In addition, in FIG. 3, illustration of an insulating layer present between layers is omitted. In such a semiconductor device S, according to voltage application by the voltage application device 3 of the semiconductor inspection device 1, an area A1 where current is generated only in the first layer L1, an area A2 where current is generated only in the second layer L2, and an area A12 where current is generated in both the first layer L1 and the second layer L2 are generated along the interface direction between layers, that is, along the surface Su of the semiconductor device S. Laser light is emitted from the first layer L1 side to the semiconductor device S such that the optical axis of the laser light is approximately perpendicular to the interface (surface Su) between the layers. As a result, heat propagates from the position of the first layer L1 where the laser light is focused. Therefore, the electrical characteristics of the first layer L1 located at a first position near the light source 9 in the optical axis direction are reflected in the characteristic signal obtained for the irradiation of the area A1. In addition, the electrical characteristics of the second layer L2 located at a second position far from the light source 9 in the optical axis direction are reflected in the characteristic signal obtained for the irradiation of the area A2. In addition, the electrical characteristics of both the first layer L1 and the second layer L2 are reflected in the characteristic signal obtained for the irradiation of the area A12.

Next, the function of the inspection device 19 will be described in detail.

The inspection device 19 controls the optical scanning device 13 to scan the areas A1, A2, and A12 on the semiconductor device S in a two-dimensional manner with at least laser light intensity-modulated with a first frequency f1 and laser light intensity-modulated with a second frequency f2 higher than the first frequency. In the present embodiment, the inspection device 19 also performs control to scan the semiconductor device S with laser light beams intensity-modulated with a plurality of frequencies other than the first and second frequencies f1 and f2. Such laser light beams intensity-modulated with a plurality of frequencies may be separately emitted. In addition, in the form of laser light intensity-modulated to a rectangular wave, a state in which laser light beams intensity-modulated with a plurality of frequencies are simultaneously emitted may be realized.

Figure 4:
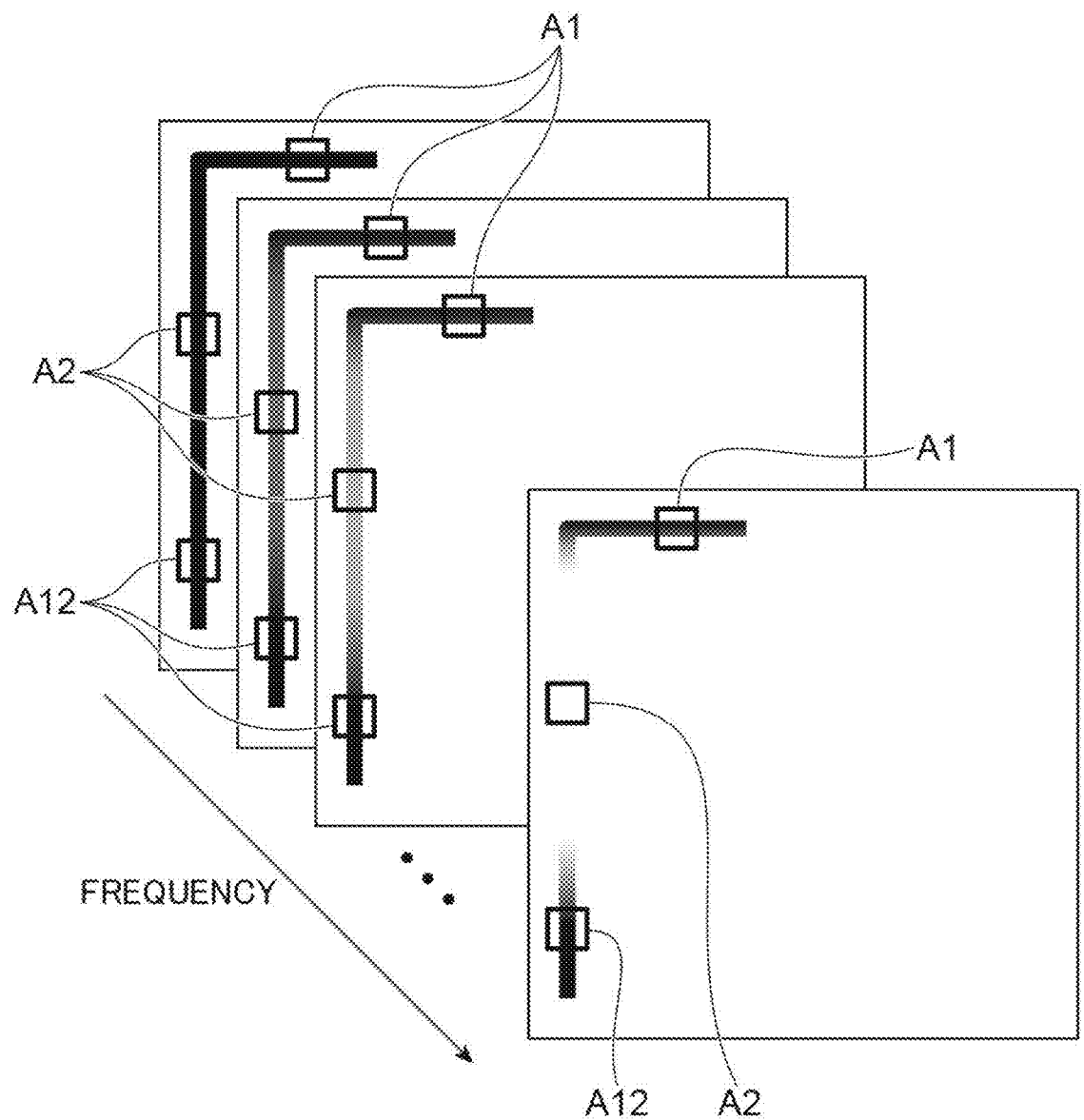
FIG. 4 is a diagram showing an image in which characteristic signals of a plurality of frequency components acquired by the inspection device 19 are expressed as two-dimensional images.

In addition, the inspection device 19 acquires a characteristic signal lock-in detected for each of a plurality of frequency components f1, f2, . . . , as a signal expressed in its phase and amplitude or complex numbers, for each scanning position of the semiconductor device S according to the scanning control of the laser light beams with the plurality of modulation frequencies f1, f2, . . . , and converts these characteristic signals into two-dimensional images and analyze the two-dimensional images. FIG. 4 shows an image in which characteristic signals of a plurality of frequency components acquired by the inspection device 19 are expressed as two-dimensional images. A filter, such as a Gaussian filter, may be applied to the two-dimensional image.

Here, each of at least one scanning position included in the area A1 of the semiconductor device S and at least one scanning position included in the area A2 of the semiconductor device S is set in advance in the inspection device 19 by the user based on the design data. Alternatively, each of the scanning positions is automatically specified in advance by the inspection device 19 based on the design data. Alternatively, the inspection device 19 may set, as a scanning position, a place where the change of the phase component with respect to the frequency, which will be described later, is the smallest.

Figure 5:
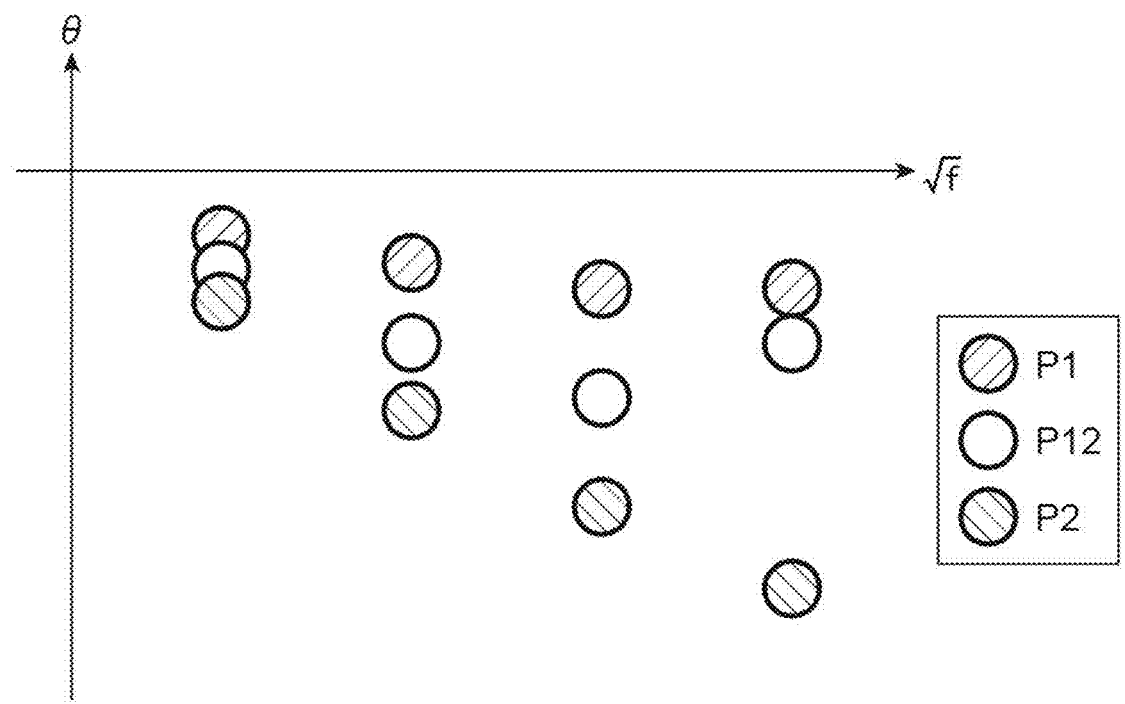
FIG. 5 is a graph plotting the relationship between the square root $f^{1/2}$ of a frequency and a phase component θ analyzed by the inspection device 19.

The inspection device 19 acquires a phase component $\theta$ of the characteristic signal obtained at each scanning position, and analyzes the relationship between the phase component $\theta$ and the square root $f^{1/2}$ of the frequency for each scanning position. FIG. 5 shows a graph plotting the relationship between the square root $f^{1/2}$ of the frequency and the phase component $\theta$ analyzed by the inspection device 19. Thus, an analysis point P1 of the phase component $\theta$ corresponding to the scanning position in the area A1, an analysis point P2 of the phase component $\theta$ corresponding to the scanning position in the area A2, and an analysis point P12 of the phase component $\theta$ corresponding to the scanning position in the area A12 are obtained so as to have different characteristics. In addition, the inspection device 19 does not necessarily need to analyze the relationship between the phase component $\theta$ and the square root $f^{1/2}$ of the frequency, and may analyze the relationship between the phase component $\theta$ and the frequency f.

Figure 6:
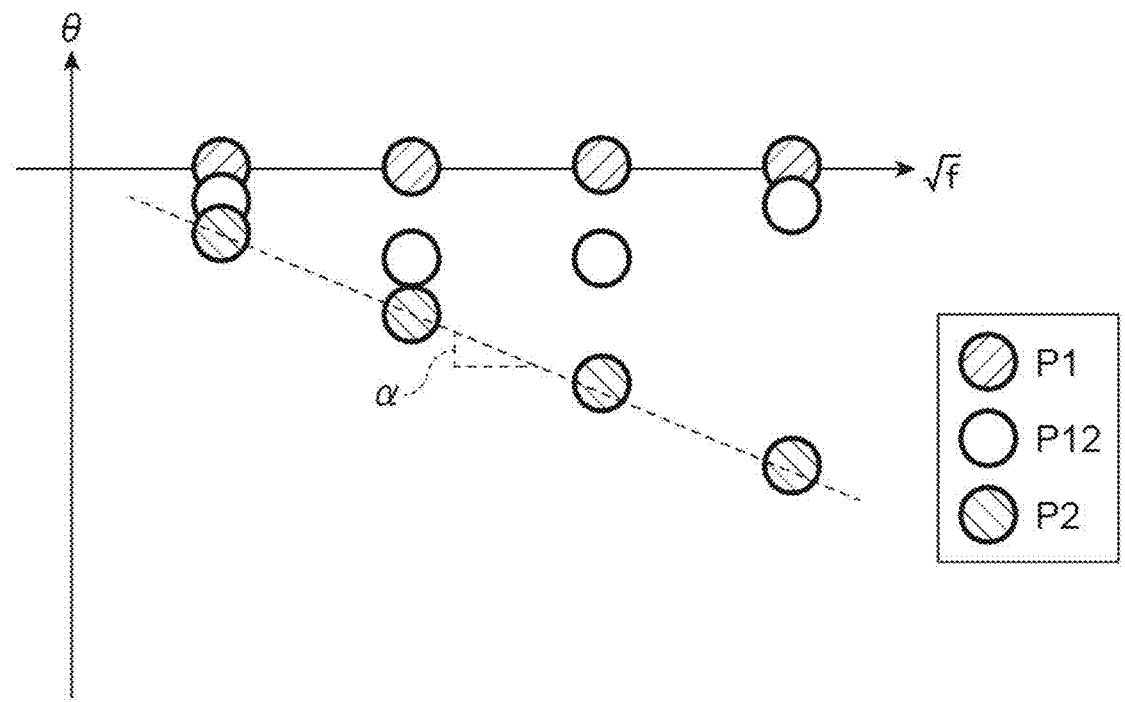
FIG. 6 is a graph plotting the relationship between the square root $f^{1/2}$ of a frequency and the phase component θ corrected by the inspection device 19.

In addition, the inspection device 19 corrects each analysis point of the phase component $\theta$ at an arbitrary scanning position obtained as described above, with the analysis point P1 of the same frequency at a known scanning position as a reference, so that the phase component $\theta$ at the analysis point P1 is canceled out. At this time, when the value changes discontinuously from $-\pi$ to $\pi$ (or vice versa) due to the cancellation of the phase component $\theta$, the inspection device 19 adds $-2\pi$ (or $2\pi$) to the phase component $\theta$ to maintain the continuity of the phase so that the subsequent analysis is not adversely affected. FIG. 6 shows a graph plotting the relationship between the square root $f^{1/2}$ of the frequency and the phase component θ corrected by the inspection device 19. The characteristics of the phase component θ corrected as described above with respect to the square root $f^{1/2}$ of the frequency are different among the areas A1, A2, and A12. That is, the characteristic corresponding to the area A1 is that a value close to zero is always obtained, the characteristic corresponding to the area A2 is a linear characteristic with an inclination a with respect to the square root $f^{1/2}$ of the frequency, and the characteristic corresponding to the area A12 is a characteristic having an extreme value.

Then, the inspection device 19 processes a specific signal at each scanning position reflecting the phase component θ corrected as described above. That is, the inspection device 19 calculates a frequency at which a characteristic signal at the scanning position included in the area A1 set in advance and a characteristic signal at the scanning position included in the area A2 set in advance have a predetermined phase difference. As an example, the predetermined phase difference is π/2 (90°).

The part (a) of FIG. 7 and the part (b) of FIG. 7 show examples of the relationships between the real part and the imaginary part of the characteristic signal at the scanning position included in the area A1 and the square root $f^{1/2}$ of the frequency. The part (a) of FIG. 8 and the part (b) of FIG. 8 show examples of the relationships between the real part and the imaginary part of the characteristic signal at the scanning position included in the area A2 and the square root $f^{1/2}$ of the frequency. Thus, the real part of the characteristic signal at each scanning position has a characteristic of decreasing as the frequency increases, and the imaginary part of the characteristic signal at the scanning position included in the area A1 is always zero due to the correction and the imaginary part of the characteristic signal at the scanning position included in the area A2 varies according to the frequency change. The inspection device 19 calculates a frequency f, at which the real part of the corrected characteristic signal at the scanning position included in the area A2 is approximated to zero, as a frequency at which the phase difference is π/2. At this time, the inspection device 19 may predict the frequency characteristics of the corrected characteristic signal at the scanning position included in the area A2 by curve fitting using a function having the square root $f^{1/2}$ of the frequency as an argument and calculate the frequency f* at which the real part is approximated to zero by using the predicted function. For the curve fitting, for example, a polynomial function is used. When using the polynomial function, a function is appropriately set in advance so that the maximum degree does not become too large.

Here, when calculating the frequency at which the characteristic signals at two scanning positions have a predetermined phase difference, the inspection device 19 may use characteristic signals before correcting the phase component with the phase of one of the characteristic signals as a reference. In this case, in order to calculate the frequency at which the phase difference is π/2, the inspection device 19 calculates a frequency at which a result obtained by multiplying the complex number indicated by one characteristic signal by the complex conjugate number of the complex number of the other characteristic signal is zero.

In addition, the inspection device 19 acquires a characteristic signal at the frequency f* calculated as described above by calculation based on the frequency characteristics of the corrected characteristic signal at an arbitrary scanning position. The part (a) of FIG. 9 and the part (b) of FIG. 9 show examples of the relationships between the real part and the imaginary part of the characteristic signal at an arbitrary scanning position and the square root $f^{1/2}$ of the frequency. At this time, the inspection device 19 can predict the frequency characteristics of the corrected characteristic signal at the arbitrary scanning position by curve fitting using a function having the square root $f^{1/2}$ of the frequency as an argument and calculate the values of the real part and the imaginary part at the frequency f* by calculation using the predicted function. For the curve fitting, for example, a polynomial function is used. When using the polynomial function, a function is appropriately set in advance so that the maximum degree does not become too large. On the other hand, the inspection device 19 may acquire the characteristic signal at an arbitrary scanning position at the frequency f* again based on the characteristic signal obtained by scanning the semiconductor device S with laser light whose modulation frequency is set to include the frequency f*.

The inspection device 19 acquires the real part and the imaginary part of the characteristic signal for each scanning position by repeating such acquisition of the characteristic signal at the frequency f* for each scanning position on the semiconductor device S. In addition, the inspection device 19 outputs the real part of the characteristic signal acquired for each scanning position and the imaginary part of the characteristic signal acquired for each scanning position to the input/output module 106, such as a display, as two-dimensional images showing the in-phase component and the quadrature component of the characteristic signal, respectively.

Figure 10:
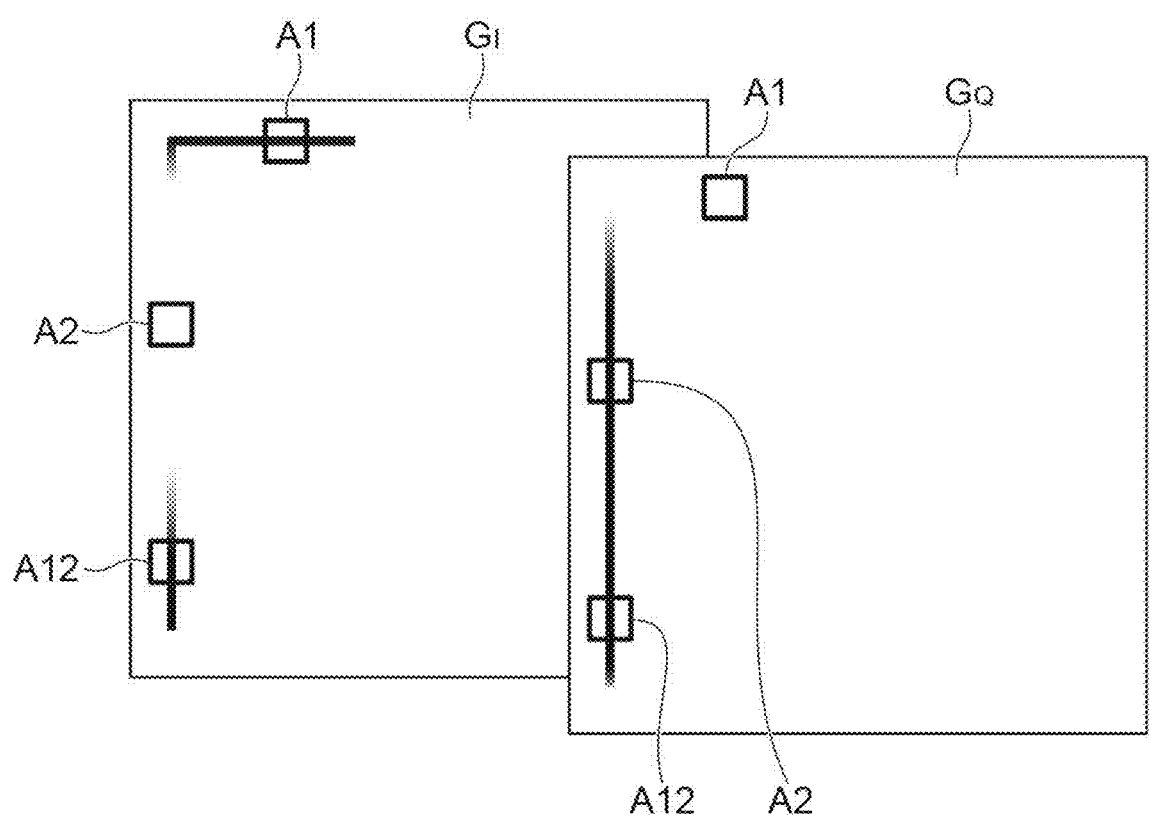
FIG. 10 shows examples of a two-dimensional image of an in-phase component and a two-dimensional image of a quadrature component output from the inspection device 19.

FIG. 10 shows examples of a two-dimensional image $G_I$ of an in-phase component and a two-dimensional image $G_Q$ of a quadrature component output from the inspection device 19. Thus, by acquiring the characteristic signal with a frequency at which the phase difference is π/2, the distribution of the electrical characteristics of the first layer L1 of the semiconductor device S is reflected on the two-dimensional image $G_I$, and the distribution of the electrical characteristics of the second layer L2 of the semiconductor device S is reflected on the two-dimensional image $G_Q$. In addition, by acquiring the characteristic signal with a frequency at which the phase difference is an arbitrary angle, both the distribution of the electrical characteristics of the first layer L1 of the semiconductor device S and the distribution of the electrical characteristics of the second layer L2 of the semiconductor device S are reflected at a predetermined ratio on the two-dimensional image $G_I$, and only the distribution of the electrical characteristics of the second layer L2 of the semiconductor device S is reflected on the two-dimensional image $G_Q$.

Figure 11:
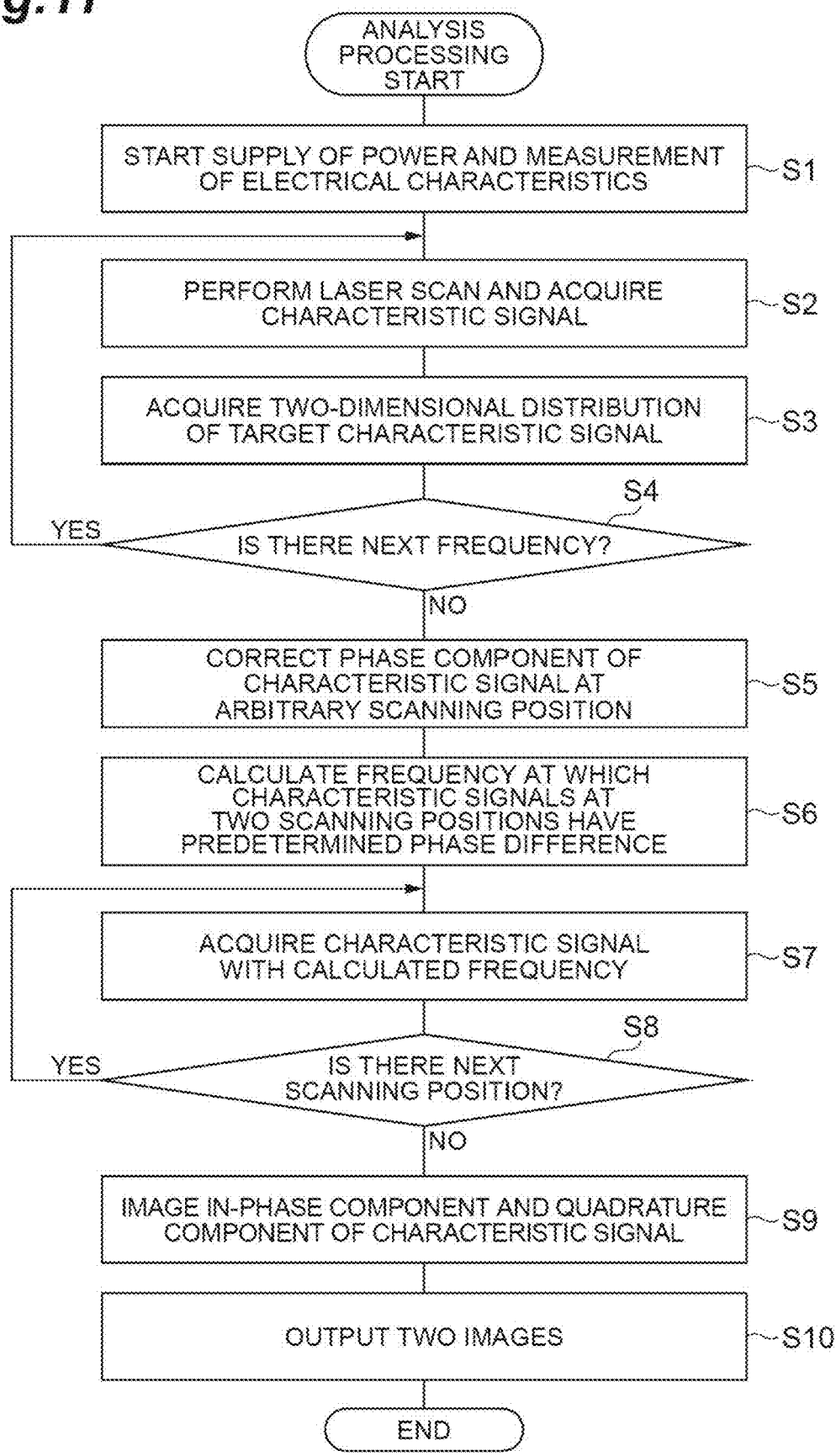
FIG. 11 is a flowchart showing a procedure of analysis processing by the semiconductor inspection device 1.

Next, the procedure of analysis processing for the semiconductor device S using the semiconductor inspection device 1 according to the present embodiment, that is, the flow of a semiconductor device inspection method according to the present embodiment will be described. FIG. 11 is a flowchart showing the procedure of analysis processing by the semiconductor inspection device 1.

First, the measuring device 7 starts the supply of power to the semiconductor device S and the measurement of the electrical characteristics of the semiconductor device S (step S1). Then, the inspection device 19 controls the operation of the optical scanning device 13, so that the semiconductor device S is two-dimensionally scanned with laser light intensity-modulated with the first frequency f1 and at the same time, the inspection device 19 acquires a characteristic signal lock-in-detected at the first frequency f1 by the lock-in amplifier 15 (step S2).

In addition, the inspection device 19 acquires a two-dimensional image showing the two-dimensional distribution of the acquired characteristic signals (step S3). Thereafter, the modulation frequency of the laser light is sequentially changed to the second frequency f1 and a frequency other than the first and second frequencies f1 and f2 (step S4), and the processes of steps S2 and S3 are repeated to obtain a plurality of characteristic signals lock-in detected at a plurality of frequencies f2, . . . .

Then, the inspection device 19 analyzes the relationship between the phase component θ of the characteristic signal and the square root $f^{1/2}$ of the frequency based on the characteristic signal at each scanning position, and corrects the analysis point of the phase component θ at an arbitrary scanning position with the analysis point of the phase component at the scanning position in the area A1 of the semiconductor device S as a reference (step S5). In addition, the inspection device 19 calculates a frequency at which the difference between the phase component θ at the scanning position in the area A1 and the phase component at the scanning position in the area A2 is a predetermined phase difference (step S6). The respective scanning positions in the areas A1 and A2 are set in advance by the user.

Thereafter, the inspection device 19 acquires the real part and the imaginary part of the characteristic signal at the frequency calculated in step S6 by calculation based on the corrected characteristic signal at one scanning position on the semiconductor device S (step S7). Then, the scanning position to be analyzed is sequentially changed (step S8), and the process of step S7 is repeated to acquire the real parts and the imaginary parts of a plurality of characteristic signals at a plurality of scanning positions.

In addition, the inspection device 19 images the values of the real parts and the imaginary parts at all scanning positions as two-dimensional images showing the in-phase component and the quadrature component (step S9). Finally, the inspection device 19 outputs the images of the in-phase component and the quadrature component (step S10).

Figure 12:
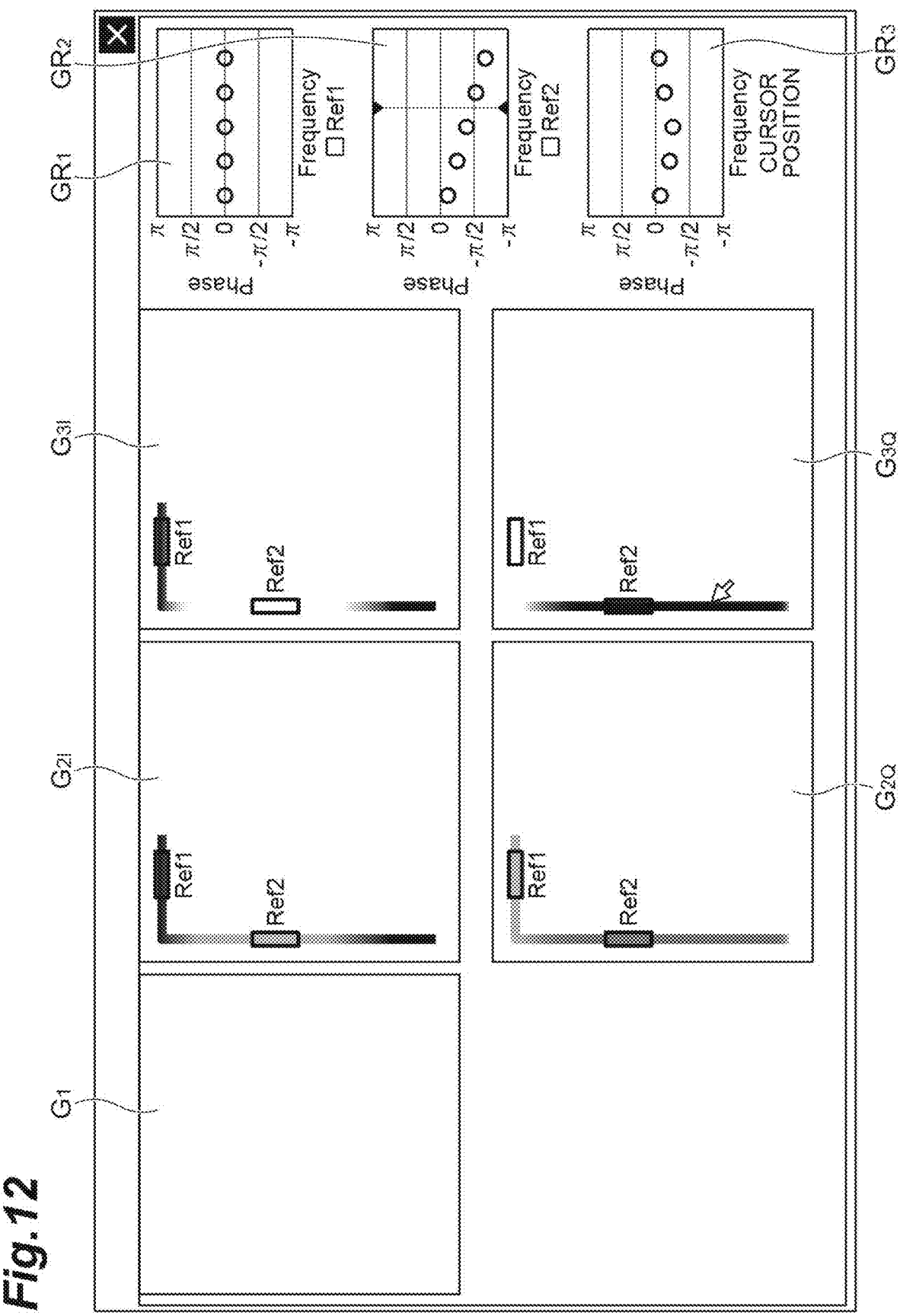
FIG. 12 is a diagram showing an output image of the analysis result of the inspection device 19.

FIG. 12 shows an output image of the analysis result of the inspection device 19. For example, the inspection device 19 outputs an optical image $G_1$ of the semiconductor device based on the intensity signal obtained from the photodetector 17, images $G_{2I}$ and $G_{2Q}$ showing the in-phase component and the quadrature component of the characteristic signal at an arbitrary designated frequency, and images $G_{3I}$ and $G_{3Q}$ showing the in-phase component and the quadrature component of the characteristic signal obtained by the analysis processing, side by side. In addition, the inspection device 19 may simultaneously output graphs $GR_1$ and $GR_2$ showing the frequency characteristics of the phase component of the characteristic signal at two scanning positions Ref1 and Ref2 set in advance and a graph $GR_3$ showing the frequency characteristics of the phase component of the characteristic signal at an arbitrary scanning position designated by the user, or may indicate a frequency at which a predetermined phase difference is obtained on the graph $GR_2$.

According to the semiconductor inspection device 1 described above, a characteristic signal is acquired by measuring the electrical characteristics of the semiconductor device S of a plurality of frequency components by performing lock-in detection while scanning the semiconductor device S with laser light modulated with a plurality of frequencies f1, f2, . . . . Then, based on the acquired characteristic signal, a frequency is calculated at which the characteristic signal at the scanning position reflecting the electrical characteristics of the first layer L1 of the semiconductor device S and the characteristic signal at the scanning position reflecting the electrical characteristics of the second layer L2 of the semiconductor device S have a predetermined phase difference. In addition, the phase component of the characteristic signal at the arbitrary scanning position is corrected with the phase component of the characteristic signal at the scanning position reflecting the electrical characteristics of the first layer L1 as a reference, a characteristic signal at the arbitrary scanning position at the calculated frequency is acquired, and the in-phase component and the quadrature component of the acquired characteristic signal are output. Therefore, it is possible to estimate the electrical characteristics of each of the layers L1 and L2 at the arbitrary scanning position of the semiconductor device S, and it is possible to analyze the electrical characteristics corresponding to the stacked structure of the semiconductor device S.

In particular, in the present embodiment, the predetermined phase difference described above is set to $\pi/2$. In this case, the in-phase component and the quadrature component of the output characteristic signal directly indicate the electrical characteristics of each of the layers L1 and L2. As a result, it is possible to easily analyze the electrical characteristics of each of the layers L1 and L2 at the arbitrary scanning position of the semiconductor device S.

In addition, in the present embodiment, an image showing the two-dimensional distribution of the in-phase component of the characteristic signal and an image showing the two-dimensional distribution of the quadrature component of the characteristic signal are output. With such a configuration, it is possible to visually grasp the distribution of the in-phase component and the quadrature component of the characteristic signal, so that it is possible to easily analyze the electrical characteristics corresponding to the stacked structure of the semiconductor device S.

In addition, the phase component of the characteristic signal at the arbitrary scanning position is corrected so as to cancel out the phase component of the characteristic signal at the scanning position in the area A1. By such an operation, it is possible to acquire the relative value of the phase component at the arbitrary scanning position with respect to the phase component of the characteristic signal at the scanning position reflecting the electrical characteristics of the first layer L1. As a result, based on the output value of the characteristic signal at the arbitrary scanning position, it is possible to easily estimate the electrical characteristics of each of the layers L1 and L2 at the arbitrary scanning position of the semiconductor device S.

In addition, in the present embodiment, the frequency of the characteristic signal at which a predetermined phase difference is obtained is calculated by predicting the frequency characteristics of the characteristic signal by curve fitting. According to such a configuration, it is possible to accurately calculate a frequency at which the phase difference between the characteristic signals at the two scanning positions is a predetermined phase difference. As a result, it is possible to analyze the electrical characteristics corresponding to the stacked structure of the semiconductor device S with high accuracy.

In addition, in the present embodiment, the characteristic signal at the calculated frequency is acquired by predicting the frequency characteristics of the characteristic signal at the arbitrary scanning position by curve fitting. According to such a configuration, it is possible to accurately acquire the characteristic signal of the calculated frequency at the arbitrary scanning position. As a result, it is possible to analyze the electrical characteristics corresponding to the stacked structure of the semiconductor device S with high accuracy.

While the various embodiments of the present invention have been described above, the present invention is not limited to the above-described embodiments, and can be modified or applied to others without departing from the scope described in the claims.

Figure 13:
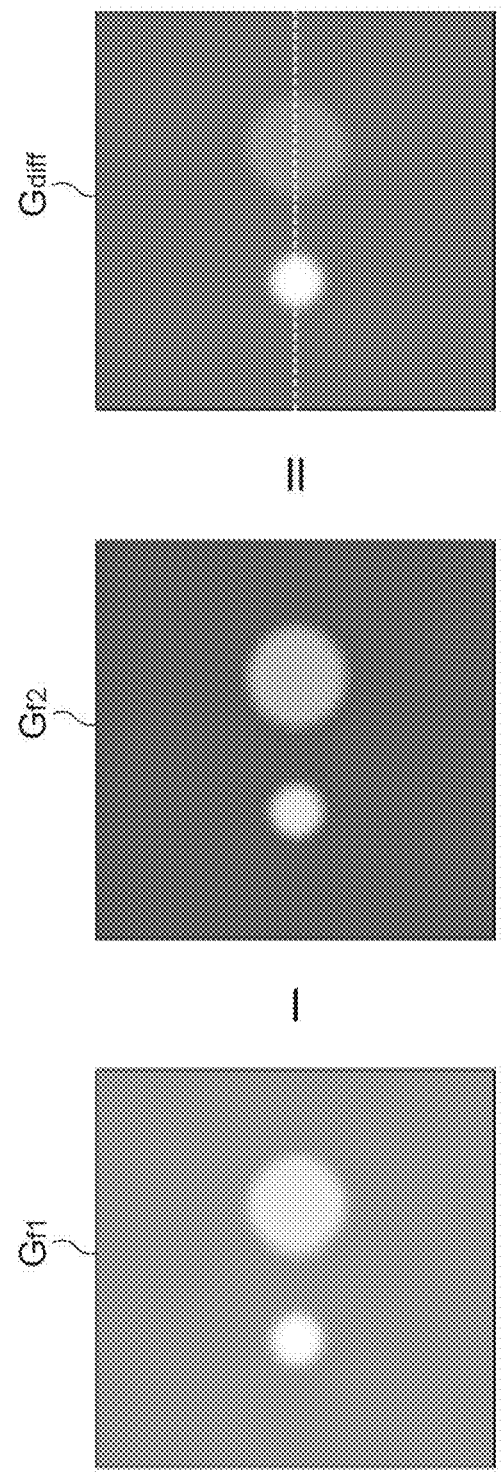
FIG. 13 is a diagram showing an image of a difference image generated according to a modification example of the present disclosure.

For example, the inspection device 19 may generate or output an image showing the two-dimensional distribution of the difference between the phase component θ of the characteristic signal lock-in detected at the first frequency f1 and the phase component θ of the characteristic signal lock-in detected at the second frequency U higher than the first frequency f1. For example, as shown in FIG. 13, a difference image $G_{diff}$ reflecting the difference in phase component θ between images $G_{f1}$ and $G_{f2}$ may be generated based on the image $G_{f1}$ showing the phase component θ at the first frequency f1 and an image $G_{f2}$ showing the phase component θ at the second frequency f2. Based on such a difference image $G_{diff}$, it is possible to visually acquire the information of the layer depth at each scanning position of the semiconductor device S. When outputting the difference image $G_{diff}$, the inspection device 19 may express the difference in phase component θ by gradation or convert the difference into a hue with reference to a LUT (Look-up Table) or the like.

Figure 14:
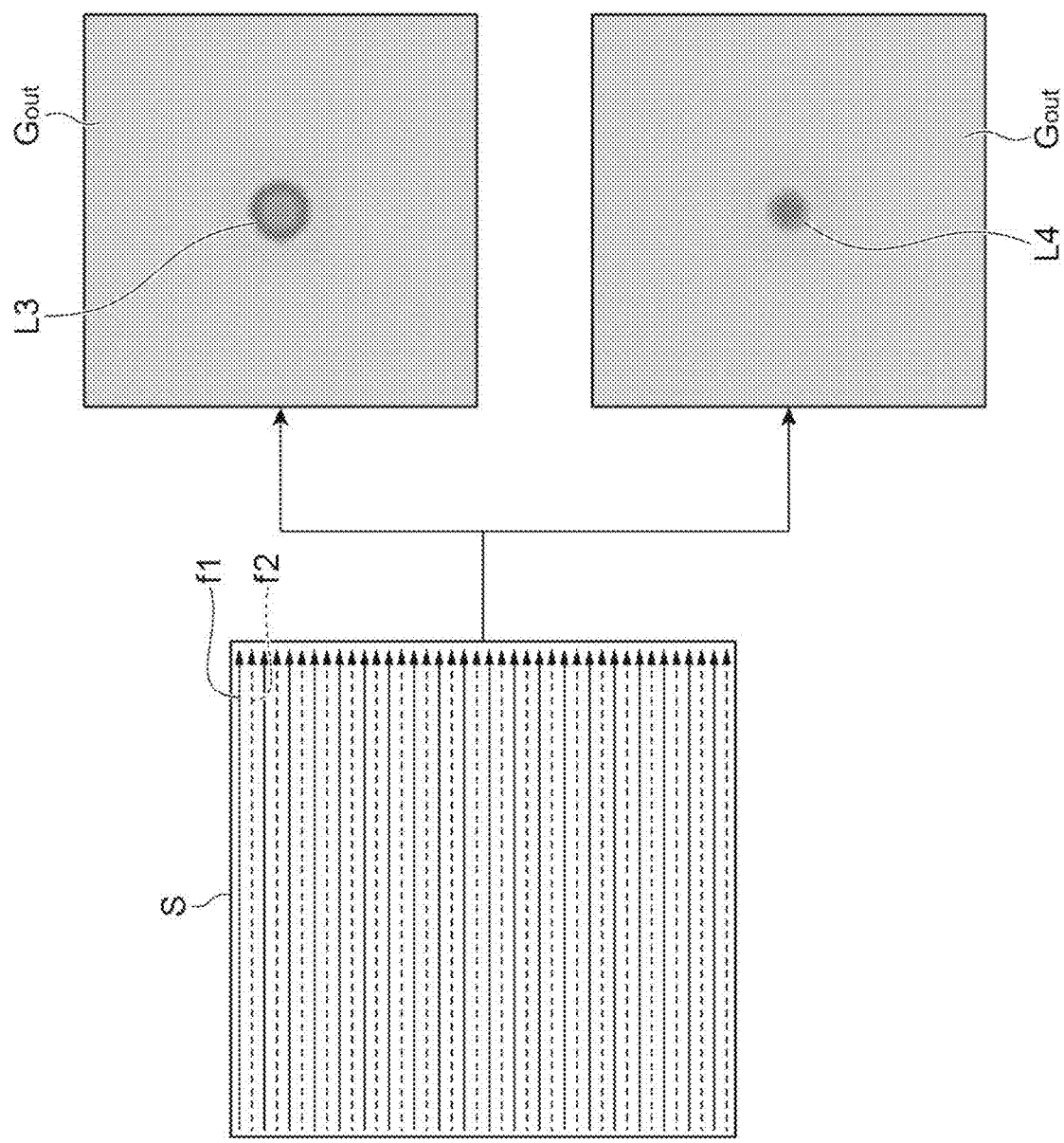
FIG. 14 is an image of an output image generated according to a modification example of the present disclosure.

In addition, the semiconductor inspection device 1 may operate to perform a two-dimensional laser light scan by repeating a one-dimensional scan along a plurality of lines on the semiconductor device S while shifting in a direction perpendicular to the lines and to change the modulation frequency for each one-dimensional scan alternately between the first frequency f1 and the second frequency. For example, the first frequency f1 is set to 1 Hz, and the second frequency is set to 4 Hz. FIG. 14 shows an example of an image $G_{out}$ showing the two-dimensional distribution of the phase component θ generated by lock-in detection corresponding to the modulation frequencies f1 and f2 for each line by the semiconductor inspection device 1 according to such a modification example. According to such a modification example, it is also possible to easily distinguish between the electrical characteristics of a layer L3 located far from the light source 9 and the electrical characteristics of a layer L4 located close to the light source 9.

In addition, in the inspection device 19, a frequency is calculated at which the phase difference between the characteristic signals at two scanning positions set in advance is π/2, but the phase difference may be set to an arbitrary angle θ. In addition, conversely, the inspection device 19 may set the frequency f* first and then calculate the phase difference θ at the frequency f* from the frequency characteristics of the phase components at the two scanning positions.

FIG. 15 shows a corrected characteristic signal at each scanning position at the frequency f*, at which the phase difference θ is obtained, as a vector displayed on the IQ plane with I as a real axis and Q as an imaginary axis, where the part (a) shows a characteristic signal in the area A12 (FIG. 3), the part (b) shows a characteristic signal in the area A2, and the part (c) shows a characteristic signal in the area A1. Thus, a characteristic signal SG after correction has a component of a characteristic signal SG' indicating the electrical characteristics of the first layer L1 having only the in-phase component I in the area A1, a component of a characteristic signal $SG_2$ indicating the electrical characteristics of the second layer L2 having a phase θ in the area A2, and a component $SG_1+SG_2$, which is obtained by combining the component of the characteristic signal $SG_1$ of the first layer L1 and the component of the characteristic signal $SG_2$ of the second layer L2, in the area A12. That is, an in-phase component $SG_I$ and a quadrature component $SG_Q$ of the characteristic signal at an arbitrary scanning position are expressed by the following equations.

$$SG_Q = |SG_2| \cdot \sin\theta$$

$$SG_I = |SG_1| + |SG_2| \cdot \cos\theta$$

Using the properties described above, the inspection device 19 acquires the value $|SG_1|$ of the characteristic signal of the first layer L1 and the value $|SG_2|$ of the characteristic signal of the second layer L2 at an arbitrary scanning position by calculation using the following equations based on the in-phase component $S_I$ and the quadrature component $S_Q$ of the characteristic signal at each scanning position at the frequency f* at which the phase difference θ is obtained.

$$|SG_1| = SG_I - SG_Q/\tan\theta$$

$$|SG_2| = SG_Q/\sin\theta$$

Based on the calculated values $|SG_1|$ and $|SG_2|$ at all scanning positions, the inspection device 19 generates images showing the two-dimensional distributions of the respective values and outputs these images.

Also in such a modification example, it is possible to output an image that directly shows the two-dimensional distribution of the electrical characteristics of each of the layers L1 and L2. As a result, it is possible to easily analyze the electrical characteristics of each of the layers L1 and L2 at the arbitrary scanning position of the semiconductor device S.

Figure 16:
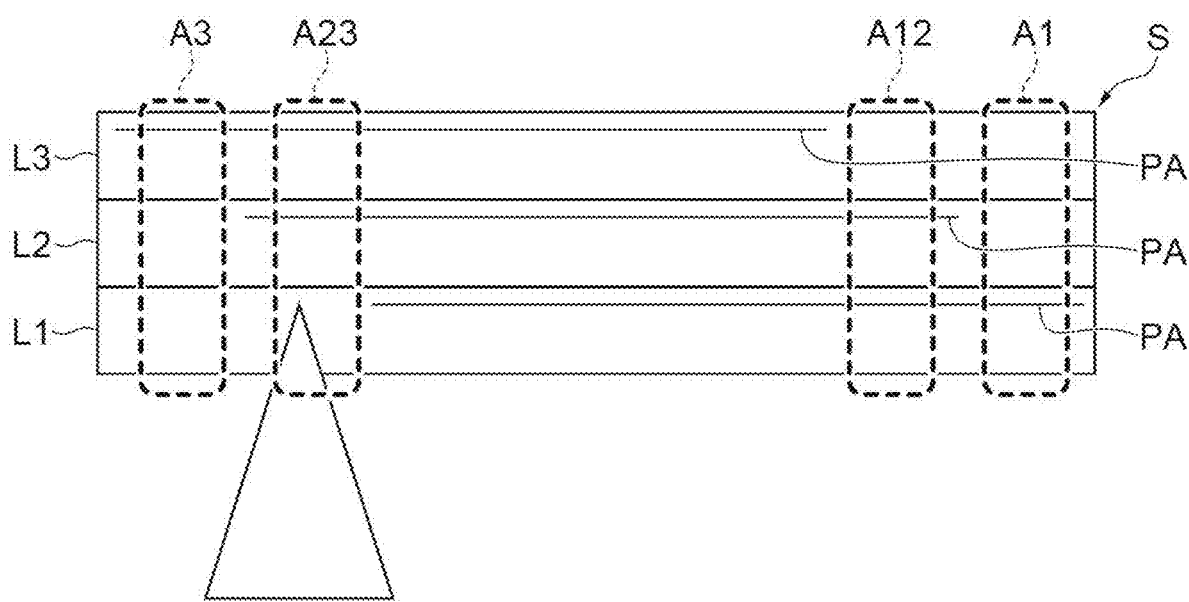
FIG. 16 is a diagram showing an example of a stacked structure of a semiconductor device S to be measured by an inspection device 19 according to a modification example.

In the embodiment described above, the semiconductor device S having a two-layer structure including the first layer L1 and the second layer L2 is a target. However, the inspection device 19 has an analysis function for the semiconductor device S having a three-layer structure or more. For example, as shown in FIG. 16, a semiconductor device S having a multilayer structure including a first layer L1 at the first position, a second layer L2 at the second position, and a third layer L3 at the third position from the side close to the light source 9 may be a target. In such a semiconductor device S, from the design data or the like, it is assumed that an area A1 having a path PA through which a current flows only in the first layer L1, an area A12 having a path PA in the first layer L1 and the second layer, an area A23 having a path PA in the second layer L2 and the third layer L3, and an area A3 having a path PA only on the third layer L3 are known. In addition, it is assumed that the laser light from the light source 9 is emitted so as to be focused on the first layer L1.

Figure 17:
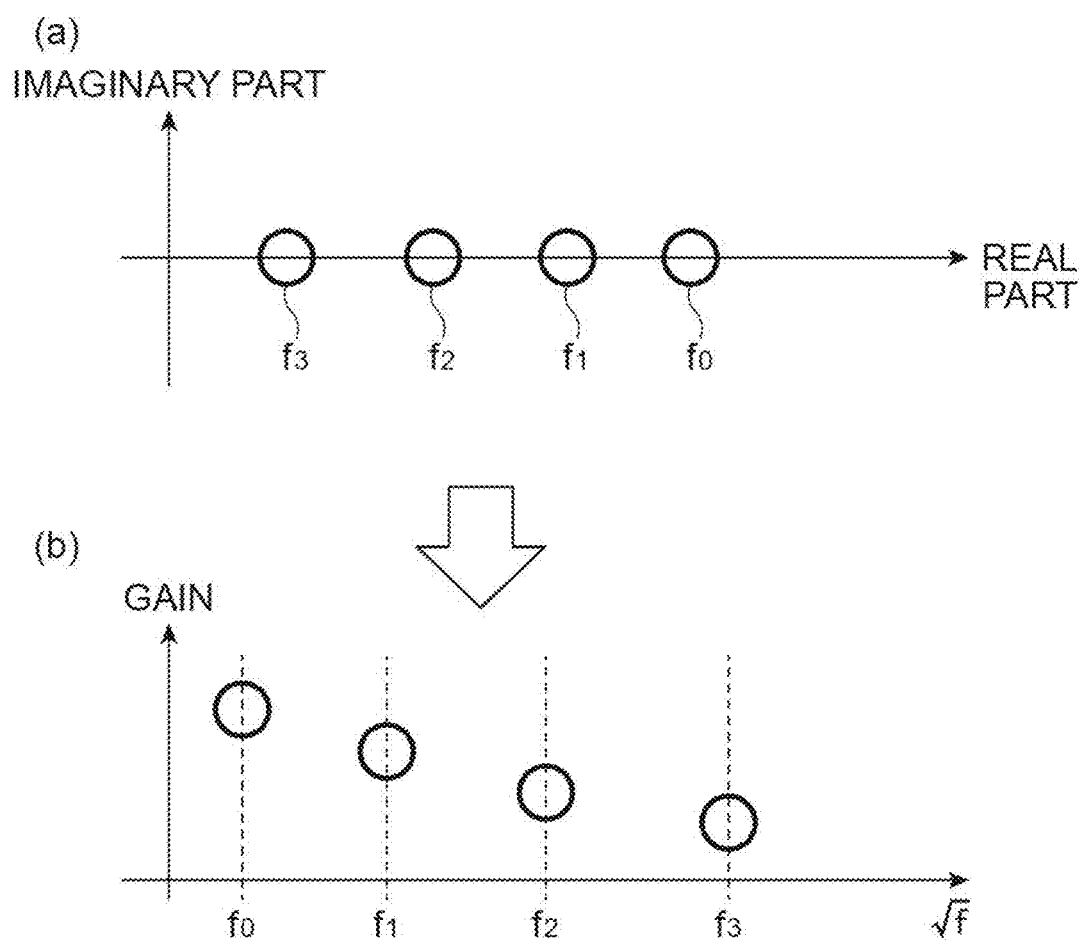
FIG. 17 is a graph showing a change for each frequency of a characteristic signal acquired by the inspection device 19 according to the modification example.

When the semiconductor device S configured as described above is a target, the inspection device 19 first performs phase correction of the characteristic signal at all scanning positions with the characteristic signal in the area A1 as a reference. Then, the analysis processing of the above-described embodiment is performed on the characteristic signal in the area A1 and the characteristic signal in the area A23 to separate the characteristic signal of the first layer L1 at all scanning positions. In addition, the inspection device 19 acquires a gain relevant to the amplitude at each frequency based on the corrected characteristic signal in the area A1. The part (a) of FIG. 17 shows a change in the characteristic signal in the area A1 acquired at each of frequencies $f_0$, $f_1$, $f_2$, and $f_3$, and the part (b) of FIG. 17 shows a gain relevant to the amplitude of the characteristic signal in the area A1 corresponding to each of the frequencies $f_0$, $f_1$, $f_2$, and $f_3$, acquired according to the change.

Then, the inspection device 19 removes the characteristic signal of the first layer L1 at each scanning position, which reflects the gain at each of the frequencies $f_0$, $f_1$, $f_2$, and $f_3$, from the characteristic signal corresponding to each of the frequencies $f_0$, $f_1$, $f_2$, and $f_3$ at each scanning position. Then, based on the characteristic signal in the area A12 after the removal, the inspection device 19 performs phase correction of the characteristic signal at all scanning positions after the removal. In addition, the analysis processing of the above-described embodiment is performed on the characteristic signal in the area A3 and the characteristic signal in the area A12 to separate the characteristic signal of the second layer L2 at all scanning positions and separate the characteristic signal of the third layer L3 at all scanning positions.

According to such a modification example, it is possible to estimate the electrical characteristics of each of the layers L1, L2, and L3 at the arbitrary scanning position for a semiconductor device having a three-layer structure.

Figure 18:
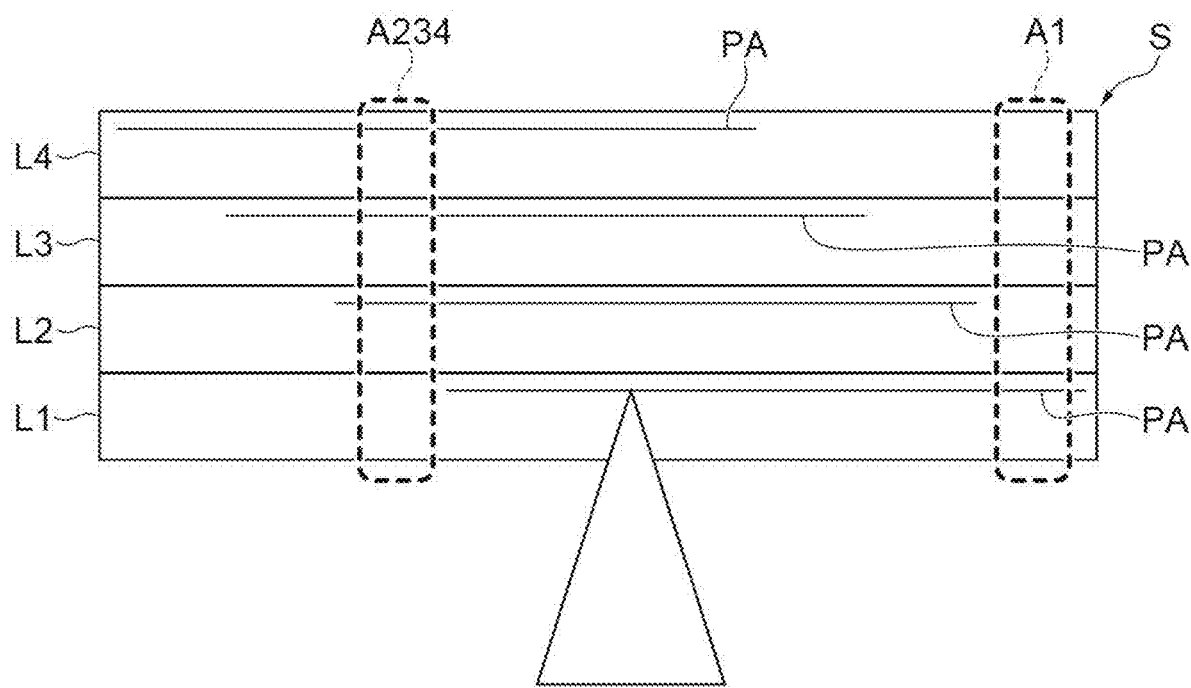
FIG. 18 is a diagram showing an example of a stacked structure of a semiconductor device S to be measured by an inspection device 19 according to a modification example.

In addition, the inspection device 19 may have an analysis function for a semiconductor device S having a four-layer structure shown in FIG. 18. The semiconductor device S shown in FIG. 18 has a multilayer structure including a first layer L1 at the first position, a second layer L2 at the second position, a third layer L3 at the third position, and a fourth layer L4 at the fourth position from the side close to the light source 9. In such a semiconductor device S, from the design data or the like, it is assumed that an area A1 having a path PA through which a current flows only in the first layer L1 and area A234 having a path PA in the second layer L2, the third layer L3, and the fourth layer L4 are known. In addition, it is assumed that the laser light from the light source 9 is emitted so as to be focused on the first layer L1.

When the semiconductor device S configured as described above is a target, the inspection device 19 first performs phase correction of the characteristic signal at all scanning positions with the characteristic signal in the area A1 as a reference. Then, the analysis processing of the above-described embodiment is performed on the characteristic signal in the area A1 and the characteristic signal in the area A234 to separate the characteristic signal of the first layer L1 at all scanning positions. Then, the inspection device 19 removes the characteristic signal of the first layer L1 at each scanning position, which reflects the gain corresponding to each frequency, from the characteristic signal corresponding to each frequency at each scanning position. Thereafter, the inspection device 19 performs the above-described analysis processing on the removed characteristic signal at each scanning position for the semiconductor device S having a three-layer structure, so that it is possible to separate the characteristic signals of the second to fourth layers L2 to L4.

According to such a modification example, it is possible to estimate the electrical characteristics of each of the layers L1, L2, L3, and L4 at the arbitrary scanning position for a semiconductor device having a fourth-layer structure. Similarly, it is possible to estimate the electrical characteristics of each layer at an arbitrary scanning position for a semiconductor device having a structure of five or more layers.

In addition, when the area A2 is present in the semiconductor device S to be measured but the area A1 is not present, the inspection device 19 may calculate a frequency, at which the characteristic signal of the first layer L1 and the characteristic signal of the second layer L2 have a predetermined phase difference, as follows.

That is, the inspection device 19 calculates the natural logarithm of the amplitude of the characteristic signal in the area A2, and analyzes the relationship between the natural logarithm and the square root $f^{1/2}$ of the frequency. FIG. 19 shows a graph plotting the relationship between the square root $f^{1/2}$ of the frequency and the characteristic signal analyzed by the inspection device 19.

By referring to such a relationship, the inspection device 19 calculates a natural logarithmic value (intercept value) when the square root $f^{1/2}$ of the frequency is 0. Then, from the intercept value, the inspection device 19 calculates the frequency f* when the natural logarithmic value decreases by a predetermined phase difference (for example, $\pi/2$). This frequency f* can be calculated as a good estimate of the frequency at which the characteristic signal of the first layer L1 and the characteristic signal of the second layer L2 have a predetermined phase difference.

In addition, when the structure including the material of the semiconductor device S is known, the inspection device 19 may use the frequency f* calculated in advance from the material and the structure as the frequency at which the characteristic signals have a predetermined phase difference.

That is, in the semiconductor device S, it is assumed that there are N layers (N is a natural number) of different materials between the first layer L1 and the second layer L2 and the density $\rho_k$, the specific heat $c_k$, the thermal conductivity $\lambda_k$, and the film thickness $d_k$ (k=0, 1, ..., N−1) are known as the structure of each of these N layers. In this case, the phase difference $\theta$ between the characteristic signal of the first layer L1 and the characteristic signal of the second layer L2 is expressed by the following equation using each frequency $\omega$ (=2$\pi$f).

$$\theta = \sqrt{\omega} \sum_{k=0}^{N-1} d_k \sqrt{\frac{\rho_k c_k}{2\lambda_k}} \qquad \text{[Equation 1]}$$

The inspection device 19 can use the frequency f*, which is calculated in advance so that the phase difference between the characteristic signal of the first layer L1 and the characteristic signal of the second layer L2 have a predetermined phase difference by using such a relational expression, in the analysis processing. In addition, the above calculation expression is set on the assumption that the semiconductor device S is approximated to a simple one-dimensional stacked structure. When the actual structure of the semiconductor device S is complicated and one-dimensional approximation is difficult, a frequency that is obtained by numerical calculation based on the finite element method or the like so as to obtain the desired phase difference may be used. Even in this manner, since there is no change in the proportional relationship between the square root of the frequency and the phase, it is possible to obtain the proportionality coefficient by numerical calculation.

In the embodiment described above, in the step of outputting, it is preferable to output an image showing a two-dimensional distribution of the in-phase component and an image showing a two-dimensional distribution of the quadrature component. In the embodiment described above, it is preferable that the processor outputs an image showing a two-dimensional distribution of the in-phase component and an image showing a two-dimensional distribution of the quadrature component. Therefore, it is possible to visually grasp the distribution of the in-phase component and the quadrature component of the characteristic signal, so that it is possible to easily analyze the electrical characteristics corresponding to the stacked structure of the semiconductor device.

In addition, in the step of outputting, it is preferable to output a value indicating the electrical characteristics of the first position at the arbitrary scanning position and a value indicating the electrical characteristics of the second position at the arbitrary scanning position based on the characteristic signal. In addition, it is preferable that the processor outputs a value indicating the electrical characteristics of the first position at the arbitrary scanning position and a value indicating the electrical characteristics of the second position at the arbitrary scanning position based on the characteristic signal. In this case, it is possible to output a value that directly indicates the electrical characteristics of each layer. As a result, it is possible to easily analyze the electrical characteristics of each layer at the arbitrary scanning position of the semiconductor device.

In addition, in the step of correcting, it is preferable to correct the phase component of the characteristic signal at the arbitrary scanning position so as to cancel out the phase component of the characteristic signal at the first scanning position. In addition, it is preferable that the processor corrects the phase component of the characteristic signal at the arbitrary scanning position so as to cancel out the phase component of the characteristic signal at the first scanning position. In this case, it is possible to acquire the relative value of the phase component at the arbitrary scanning position with respect to the phase component of the characteristic signal at the first scanning position reflecting the electrical characteristics of the first position. As a result, it is possible to easily estimate the electrical characteristics of each layer at the arbitrary scanning position of the semiconductor device based on the output value.

In addition, in the step of calculating, it is preferable to calculate the frequency of the characteristic signal by predicting frequency characteristics of the characteristic signal by curve fitting. In addition, it is preferable that the processor calculates the frequency of the characteristic signal by predicting frequency characteristics of the characteristic signal by curve fitting. According to such a configuration, it is possible to accurately calculate a frequency at which the characteristic signal at the first scanning position and the characteristic signal at the second scanning position have a predetermined phase difference. As a result, it is possible to analyze the electrical characteristics corresponding to the stacked structure of the semiconductor device with high accuracy.

In addition, in the step of outputting, it is preferable to acquire the characteristic signal at the frequency by predicting frequency characteristics of the characteristic signal at the arbitrary scanning position by curve fitting. In addition, it is preferable that the processor acquires the characteristic signal at the frequency by predicting frequency characteristics of the characteristic signal at the arbitrary scanning position by curve fitting. According to such a configuration, it is possible to accurately acquire the characteristic signal of the calculated frequency at the arbitrary scanning position. As a result, it is possible to analyze the electrical characteristics corresponding to the stacked structure of the semiconductor device with high accuracy.

In addition, in the embodiment described above, it is preferable that the predetermined phase difference is $\pi/2$. By adopting such a configuration, the output in-phase component and the output quadrature component of the characteristic signal directly indicate the electrical characteristics of each layer. As a result, it is possible to easily analyze the electrical characteristics of each layer at the arbitrary scanning position of the semiconductor device.

INDUSTRIAL APPLICABILITY

The embodiment is intended for use as a semiconductor device inspection method and a semiconductor device inspection device, so that it is possible to analyze the electrical characteristics corresponding to the stacked structure of a semiconductor device.

REFERENCE SIGNS LIST

1: semiconductor inspection device, 3: voltage application device, 5: current measuring device, 7: measuring device, 9: light source, 11: signal source, 13: optical scanning device, 15: lock-in amplifier (signal acquisition device), 17: photodetector, 19: inspection device, 101: CPU (processor), 102: RAM, 103: ROM, 104: communication module, 106: input/output module, S: semiconductor device.

The invention claimed is:

1. A semiconductor device inspection method, comprising:
   supplying power to a semiconductor device and measuring electrical characteristics of the semiconductor device according to the supply of the power;
   scanning the semiconductor device with light intensity-modulated with a first frequency and light intensity-modulated with a second frequency higher than the first frequency and acquiring a characteristic signal indicating the electrical characteristics of the first frequency component and the second frequency component according to the scanning;
   calculating a frequency of the characteristic signal at which the characteristic signal at a first scanning position reflecting the electrical characteristics of a first position in an optical axis direction of the light in the semiconductor device and the characteristic signal at a second scanning position reflecting the electrical characteristics of a second position in the optical axis direction of the light in the semiconductor device have a predetermined phase difference;
   correcting a phase component of the characteristic signal at an arbitrary scanning position with a phase component of the characteristic signal at the first scanning position in the semiconductor device as a reference; and
   acquiring the characteristic signal at the arbitrary scanning position at the calculated frequency and outputting an in-phase component and a quadrature component of the characteristic signal.

2. The semiconductor device inspection method according to claim 1,
   wherein, in the outputting, an image showing a two-dimensional distribution of the in-phase component and an image showing a two-dimensional distribution of the quadrature component are output.

3. The semiconductor device inspection method according to claim 1,
   wherein, in the outputting, a value indicating the electrical characteristics of the first position at the arbitrary scanning position and a value indicating the electrical characteristics of the second position at the arbitrary scanning position are output based on the characteristic signal.

4. The semiconductor device inspection method according to claim 1, wherein, in the correcting, the phase component of the characteristic signal at the arbitrary scanning position is corrected so as to cancel out the phase component of the characteristic signal at the first scanning position.

5. The semiconductor device inspection method according to claim 1,
wherein, in the calculating, the frequency of the characteristic signal is calculated by predicting frequency characteristics of the characteristic signal by curve fitting.

6. The semiconductor device inspection method according to claim 1,
wherein, in the outputting, the characteristic signal at the frequency is acquired by predicting frequency characteristics of the characteristic signal at the arbitrary scanning position by curve fitting.

7. The semiconductor device inspection method according to claim 1,
wherein the predetermined phase difference is $\pi/2$.

8. A semiconductor device inspection device, comprising:
a measuring device configured to supply power to a semiconductor device and measure electrical characteristics of the semiconductor device according to the supply of the power;
an optical scanner configured to scan the semiconductor device with light intensity-modulated with a first frequency and light intensity-modulated with a second frequency higher than the first frequency;
a signal acquisition device configured to acquire a characteristic signal indicating the electrical characteristics of the first frequency component and the second frequency component according to the scanning of the light; and
a processor configured to process the characteristic signal,
wherein the processor calculates a frequency of the characteristic signal at which the characteristic signal at a first scanning position reflecting the electrical characteristics of a first position in an optical axis direction of the light in the semiconductor device and the characteristic signal at a second scanning position reflecting the electrical characteristics of a second position in the optical axis direction of the light in the semiconductor device have a predetermined phase difference, corrects a phase component of the characteristic signal at an arbitrary scanning position with a phase component of the characteristic signal at the first scanning position in the semiconductor device as a reference, acquires the characteristic signal at the arbitrary scanning position at the calculated frequency, and outputs an in-phase component and a quadrature component of the characteristic signal.

9. The semiconductor device inspection device according to claim 8,
wherein the processor outputs an image showing a two-dimensional distribution of the in-phase component and an image showing a two-dimensional distribution of the quadrature component.

10. The semiconductor device inspection device according to claim 8,
wherein the processor outputs a value indicating the electrical characteristics of the first position at the arbitrary scanning position and a value indicating the electrical characteristics of the second position at the arbitrary scanning position based on the characteristic signal.

11. The semiconductor device inspection device according to claim 8,
wherein the processor corrects the phase component of the characteristic signal at the arbitrary scanning position so as to cancel out the phase component of the characteristic signal at the first scanning position.

12. The semiconductor device inspection device according to claim 8,
wherein the processor calculates the frequency of the characteristic signal by predicting frequency characteristics of the characteristic signal by curve fitting.

13. The semiconductor device inspection device according to claim 8,
wherein the processor acquires the characteristic signal at the frequency by predicting frequency characteristics of the characteristic signal at the arbitrary scanning position by curve fitting.

14. The semiconductor device inspection device according to claim 8,
wherein the predetermined phase difference is $\pi/2$.

* * * * *